(12) United States Patent
Qian et al.

(10) Patent No.: US 10,579,101 B2
(45) Date of Patent: *Mar. 3, 2020

(54) EXPOSED GLASS ARTICLE WITH ENHANCED STIFFNESS FOR PORTABLE ELECTRONIC DEVICE HOUSING

(71) Applicant: Apple Inc., Cupertino, CA (US)

(72) Inventors: Amy Qian, Cupertino, CA (US); Daniel D. Sunshine, Sunnyvale, CA (US); Jeremy C. Franklin, San Francisco, CA (US); Michael K. Pilliod, Venice, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/138,945

(22) Filed: Sep. 21, 2018

(65) Prior Publication Data
US 2019/0086963 A1     Mar. 21, 2019

Related U.S. Application Data

(63) Continuation of application No. 15/884,700, filed on Jan. 31, 2018, which is a continuation of application
(Continued)

(51) Int. Cl.
*B32B 3/00* (2006.01)
*G06F 1/16* (2006.01)
(Continued)

(52) U.S. Cl.
CPC .............. *G06F 1/1643* (2013.01); *B32B 7/12* (2013.01); *B32B 17/06* (2013.01); *B32B 17/067* (2013.01);
(Continued)

(58) Field of Classification Search
CPC .......... H05K 5/03; G06F 1/1643; B32B 7/12; B32B 17/06; B32B 2457/20
See application file for complete search history.

(56) References Cited

U.S. PATENT DOCUMENTS 3,415,637 A    12/1968  Glynn
3,441,398 A    4/1969   Hess
(Continued)

FOREIGN PATENT DOCUMENTS

AT    283630     10/1970
CN    1277090    12/2000
(Continued)

OTHER PUBLICATIONS

Aben, "Laboratory of Photoelasticity," Institute of Cybernetics at TTU, www.ioc.ee/res/photo.html, Oct. 5, 2000.
(Continued)

*Primary Examiner* — Elizabeth E Mulvaney
(74) *Attorney, Agent, or Firm* — Brownstein Hyatt Farber Schreck, LLP

(57) ABSTRACT

A transparent article, such as a transparent cover, for use as a cover glass for an electronic device, as well as methods for producing transparent articles, are disclosed. The transparent article can form a part of a housing of the portable electronic device and can provide an outer surface for a portion of the housing. The transparent article can be provided over a display of portable electronic device to provide a protective outer cover over the display. In one embodiment, the transparent article can be formed with a laminate structure. In another embodiment, the transparent article can be formed with a ribbed structure. In still another embodiment, a sapphire coating can be deposited on the transparent article to improve it strength. Advantageously, the transparent
(Continued)

article is able to be not only thin and lightweight but also provide sufficient stiffness for use as a cover glass.

20 Claims, 13 Drawing Sheets

Related U.S. Application Data

No. 14/193,792, filed on Feb. 28, 2014, now Pat. No. 9,886,062.

(51) Int. Cl.

| | |
|---|---|
| B32B 17/06 | (2006.01) |
| B32B 7/12 | (2006.01) |
| B32B 37/12 | (2006.01) |
| C03C 21/00 | (2006.01) |
| H05K 5/03 | (2006.01) |
| G02F 1/1333 | (2006.01) |
| H04M 1/02 | (2006.01) |

(52) U.S. Cl.
CPC .............. *B32B 37/12* (2013.01); *C03C 21/00* (2013.01); *H05K 5/03* (2013.01); *B32B 2262/101* (2013.01); *B32B 2457/20* (2013.01); *B32B 2457/208* (2013.01); *G02F 2001/133331* (2013.01); *H04M 1/0266* (2013.01); *Y10T 428/24967* (2015.01)

(56) References Cited

U.S. PATENT DOCUMENTS

| | | |
|---|---|---|
| 3,467,508 A | 9/1969 | Loukes et al. |
| 3,498,773 A | 3/1970 | Due et al. |
| 3,558,415 A | 1/1971 | Rieser et al. |
| 3,607,172 A | 9/1971 | Poole et al. |
| 3,619,240 A | 11/1971 | Toussaint et al. |
| 3,626,723 A | 12/1971 | Emile |
| 3,652,244 A | 3/1972 | Plumat |
| 3,753,840 A | 8/1973 | Plumat |
| 3,798,013 A | 3/1974 | Hasegawa et al. |
| 3,843,472 A | 10/1974 | Toussaint et al. |
| 3,857,689 A | 12/1974 | Koizumi et al. |
| 3,951,707 A | 4/1976 | Kurtz et al. |
| 4,015,045 A | 3/1977 | Rinehart |
| 4,119,760 A | 10/1978 | Rinehart |
| 4,156,755 A | 5/1979 | Rinehart |
| 4,165,228 A | 8/1979 | Ebata et al. |
| 4,178,082 A | 12/1979 | Ganswein et al. |
| 4,212,919 A | 7/1980 | Hoda |
| 4,346,601 A | 8/1982 | France |
| 4,353,649 A | 10/1982 | Kishii |
| 4,425,810 A | 1/1984 | Simon et al. |
| 4,646,722 A | 3/1987 | Silverstein et al. |
| 4,733,973 A | 3/1988 | Machak et al. |
| 4,842,629 A | 6/1989 | Clemens et al. |
| 4,844,724 A | 7/1989 | Sakai et al. |
| 4,846,868 A | 7/1989 | Aratani |
| 4,849,002 A | 7/1989 | Rapp |
| 4,872,896 A | 10/1989 | LaCourse et al. |
| 4,911,743 A | 3/1990 | Bagby |
| 4,937,129 A | 6/1990 | Yamazaki |
| 4,957,364 A | 9/1990 | Chesler |
| 4,959,548 A | 9/1990 | Kupperman et al. |
| 4,983,197 A | 1/1991 | Froning et al. |
| 4,986,130 A | 1/1991 | Engelhaupt et al. |
| 5,041,173 A | 8/1991 | Shikata et al. |
| 5,104,435 A | 4/1992 | Oikawa et al. |
| 5,129,934 A | 7/1992 | Koss |
| 5,157,746 A | 10/1992 | Tobita et al. |
| 5,160,523 A | 11/1992 | Honkanen et al. |
| 5,254,149 A | 10/1993 | Hashemi et al. |
| 5,269,888 A | 12/1993 | Morasca |
| 5,281,303 A | 1/1994 | Beguin et al. |
| 5,369,267 A | 11/1994 | Johnson et al. |
| 5,411,563 A | 5/1995 | Yeh |
| 5,437,193 A | 8/1995 | Schleitweiler et al. |
| 5,445,871 A | 8/1995 | Murase et al. |
| 5,483,261 A | 1/1996 | Yasutake |
| 5,488,204 A | 1/1996 | Mead et al. |
| 5,525,138 A | 6/1996 | Hashemi et al. |
| 5,625,154 A | 4/1997 | Matsuhiro et al. |
| 5,654,057 A | 8/1997 | Kitayama |
| 5,725,625 A | 3/1998 | Kitayama et al. |
| 5,733,622 A | 3/1998 | Starcke et al. |
| 5,766,493 A | 6/1998 | Shin |
| 5,780,371 A | 7/1998 | Rifqi et al. |
| 5,816,225 A | 10/1998 | Koch et al. |
| 5,825,352 A | 10/1998 | Bisset et al. |
| 5,826,601 A | 10/1998 | Muraoka et al. |
| 5,835,079 A | 11/1998 | Shieh |
| 5,880,411 A | 3/1999 | Gillespie et al. |
| 5,930,047 A | 7/1999 | Gunz et al. |
| 5,953,094 A | 9/1999 | Matsuoka et al. |
| 5,985,014 A | 11/1999 | Ueda et al. |
| 6,050,870 A | 4/2000 | Suginoya et al. |
| 6,114,039 A | 9/2000 | Rifqui |
| 6,120,908 A | 9/2000 | Papanu et al. |
| 6,166,915 A | 12/2000 | Lake et al. |
| 6,188,391 B1 | 2/2001 | Seely et al. |
| 6,245,313 B1 | 6/2001 | Suzuki et al. |
| 6,287,674 B1 | 9/2001 | Verlinden et al. |
| 6,307,590 B1 | 10/2001 | Yoshida |
| 6,310,610 B1 | 10/2001 | Beaton et al. |
| 6,323,846 B1 | 11/2001 | Westerman et al. |
| 6,325,704 B1 | 12/2001 | Brown et al. |
| 6,327,011 B2 | 12/2001 | Kim |
| 6,350,664 B1 | 2/2002 | Haji et al. |
| 6,393,180 B1 | 5/2002 | Farries et al. |
| 6,429,840 B1 | 8/2002 | Sekiguchi |
| 6,437,867 B2 | 8/2002 | Zeylikovich et al. |
| 6,516,634 B1 | 2/2003 | Green et al. |
| 6,521,862 B1 | 2/2003 | Brannon |
| 6,621,542 B1 | 9/2003 | Aruga |
| 6,690,387 B2 | 2/2004 | Zimmerman et al. |
| 6,718,612 B2 | 4/2004 | Bajorek |
| 6,769,274 B2 | 8/2004 | Cho et al. |
| 6,810,688 B1 | 11/2004 | Duisit et al. |
| 6,936,741 B2 | 8/2005 | Munnig et al. |
| 6,955,971 B2 | 10/2005 | Ghyselen et al. |
| 6,996,324 B2 | 2/2006 | Hiraka et al. |
| 7,012,700 B2 | 3/2006 | De Groot et al. |
| 7,013,709 B2 | 3/2006 | Hajduk et al. |
| 7,015,894 B2 | 3/2006 | Morohoshi |
| 7,070,837 B2 | 7/2006 | Ross |
| 7,166,531 B1 | 1/2007 | van Den Hoek et al. |
| 7,184,064 B2 | 2/2007 | Zimmerman et al. |
| 7,461,564 B2 | 12/2008 | Glaesemann |
| 7,558,054 B1 | 7/2009 | Prest et al. |
| 7,626,807 B2 | 12/2009 | Hsu |
| 7,663,607 B2 | 2/2010 | Hotelling et al. |
| 7,810,355 B2 | 10/2010 | Feinstein et al. |
| 7,872,644 B2 | 1/2011 | Hong et al. |
| 7,918,019 B2 | 4/2011 | Chang et al. |
| 8,013,834 B2 | 9/2011 | Kim |
| 8,110,268 B2 | 2/2012 | Hegemier et al. |
| 8,111,248 B2 | 2/2012 | Lee et al. |
| 8,312,743 B2 | 11/2012 | Pun et al. |
| 8,393,175 B2 | 3/2013 | Kohli et al. |
| 8,551,283 B2 | 10/2013 | Pakula et al. |
| 8,673,163 B2 | 3/2014 | Zhong |
| 8,684,613 B2 | 4/2014 | Weber et al. |
| 8,824,140 B2 | 9/2014 | Prest |
| 2002/0035853 A1 | 3/2002 | Brown et al. |
| 2002/0105793 A1 | 8/2002 | Oda |
| 2002/0155302 A1 | 10/2002 | Smith et al. |
| 2002/0157199 A1 | 10/2002 | Piltingsrud |
| 2003/0024274 A1 | 2/2003 | Cho et al. |
| 2003/0057183 A1 | 3/2003 | Cho et al. |
| 2003/0077453 A1 | 4/2003 | Oaku et al. |
| 2003/0184514 A1 | 10/2003 | Grosfeld et al. |
| 2003/0234771 A1 | 12/2003 | Mulligan et al. |
| 2004/0051944 A1 | 3/2004 | Stark |

(56) References Cited

U.S. PATENT DOCUMENTS

| | | |
|---|---|---|
| 2004/0119701 A1 | 6/2004 | Mulligan et al. |
| 2004/0137828 A1 | 7/2004 | Takahashi et al. |
| 2004/0142118 A1 | 7/2004 | Takechi |
| 2004/0163414 A1 | 8/2004 | Eto et al. |
| 2005/0058423 A1 | 3/2005 | Brinkmann et al. |
| 2005/0105071 A1 | 5/2005 | Ishii |
| 2005/0135724 A1 | 6/2005 | Helvajian et al. |
| 2005/0174525 A1 | 8/2005 | Tsuboi |
| 2005/0193772 A1 | 9/2005 | Davidson |
| 2005/0245165 A1 | 11/2005 | Harada et al. |
| 2005/0259438 A1 | 11/2005 | Mizutani |
| 2005/0285991 A1 | 12/2005 | Yamazaki |
| 2006/0026521 A1 | 2/2006 | Hotelling et al. |
| 2006/0055936 A1 | 3/2006 | Yun et al. |
| 2006/0063351 A1 | 3/2006 | Jain |
| 2006/0070694 A1 | 4/2006 | Rehfeld et al. |
| 2006/0097991 A1 | 5/2006 | Hotelling et al. |
| 2006/0197753 A1 | 9/2006 | Hotelling et al. |
| 2006/0227331 A1 | 10/2006 | Wollmer et al. |
| 2006/0238695 A1 | 10/2006 | Miyamoto |
| 2006/0250559 A1 | 11/2006 | Bocko et al. |
| 2006/0268528 A1 | 11/2006 | Zadesky et al. |
| 2006/0292822 A1 | 12/2006 | Xie |
| 2007/0003796 A1 | 1/2007 | Isono et al. |
| 2007/0013822 A1 | 1/2007 | Kawata et al. |
| 2007/0029519 A1 | 2/2007 | Kikuyama et al. |
| 2007/0030436 A1 | 2/2007 | Sasabayashi |
| 2007/0039353 A1 | 2/2007 | Kamiya |
| 2007/0046200 A1 | 3/2007 | Fu et al. |
| 2007/0063876 A1 | 3/2007 | Wong |
| 2007/0089827 A1 | 4/2007 | Funatsu |
| 2007/0108032 A1 | 5/2007 | Matsumoto et al. |
| 2007/0122542 A1 | 5/2007 | Halsey et al. |
| 2007/0132737 A1 | 6/2007 | Mulligan et al. |
| 2007/0196578 A1 | 8/2007 | Karp et al. |
| 2007/0236618 A1 | 10/2007 | Maag et al. |
| 2008/0026260 A1 | 1/2008 | Kawai |
| 2008/0074028 A1 | 3/2008 | Ozolins et al. |
| 2008/0094716 A1 | 4/2008 | Ushiro et al. |
| 2008/0135175 A1 | 6/2008 | Higuchi |
| 2008/0158181 A1 | 7/2008 | Hamblin et al. |
| 2008/0202167 A1 | 8/2008 | Cavallaro et al. |
| 2008/0230177 A1 | 9/2008 | Crouser et al. |
| 2008/0243321 A1 | 10/2008 | Walser et al. |
| 2008/0261057 A1 | 10/2008 | Slobodin |
| 2008/0264176 A1 | 10/2008 | Bertrand et al. |
| 2008/0286548 A1 | 11/2008 | Ellison et al. |
| 2009/0046240 A1 | 2/2009 | Bolton |
| 2009/0067141 A1 | 3/2009 | Dabov et al. |
| 2009/0091549 A1 | 4/2009 | Matsumoto et al. |
| 2009/0091551 A1 | 4/2009 | Hotelling et al. |
| 2009/0096937 A1 | 4/2009 | Bauer et al. |
| 2009/0153729 A1 | 6/2009 | Hiltunen et al. |
| 2009/0162703 A1 | 6/2009 | Kawai |
| 2009/0197048 A1 | 8/2009 | Amin et al. |
| 2009/0202808 A1 | 8/2009 | Glaesemann et al. |
| 2009/0220761 A1 | 9/2009 | Dejneka et al. |
| 2009/0257189 A1 | 10/2009 | Wang et al. |
| 2009/0294420 A1 | 12/2009 | Abramov et al. |
| 2009/0324899 A1 | 12/2009 | Feinstein et al. |
| 2009/0324939 A1 | 12/2009 | Feinstein et al. |
| 2010/0009154 A1 | 1/2010 | Allan et al. |
| 2010/0028607 A1 | 2/2010 | Lee et al. |
| 2010/0035038 A1 | 2/2010 | Barefoot et al. |
| 2010/0053632 A1 | 3/2010 | Alphonse et al. |
| 2010/0062284 A1 | 3/2010 | Watanabe et al. |
| 2010/0119846 A1 | 5/2010 | Sawada |
| 2010/0137031 A1 | 6/2010 | Griffin et al. |
| 2010/0154992 A1 | 6/2010 | Feinstein et al. |
| 2010/0167059 A1 | 7/2010 | Hasimoto et al. |
| 2010/0171920 A1 | 7/2010 | Nishiyama |
| 2010/0179044 A1 | 7/2010 | Sellier et al. |
| 2010/0206008 A1 | 8/2010 | Harvey et al. |
| 2010/0215862 A1 | 8/2010 | Gomez et al. |
| 2010/0216514 A1 | 8/2010 | Smoyer et al. |
| 2010/0224767 A1 | 9/2010 | Kawano et al. |
| 2010/0265188 A1 | 10/2010 | Chang et al. |
| 2010/0279067 A1 | 11/2010 | Sabia et al. |
| 2010/0285275 A1 | 11/2010 | Baca et al. |
| 2010/0296027 A1 | 11/2010 | Matsuhira et al. |
| 2010/0315570 A1 | 12/2010 | Mathew et al. |
| 2010/0321305 A1 | 12/2010 | Chang et al. |
| 2011/0003619 A1 | 1/2011 | Fujii |
| 2011/0012873 A1 | 1/2011 | Prest |
| 2011/0019123 A1 | 1/2011 | Prest et al. |
| 2011/0019354 A1 | 1/2011 | Prest et al. |
| 2011/0030209 A1 | 2/2011 | Chang et al. |
| 2011/0050657 A1 | 3/2011 | Yamada |
| 2011/0063550 A1 | 3/2011 | Gettemy et al. |
| 2011/0067447 A1 | 3/2011 | Prest et al. |
| 2011/0072856 A1 | 3/2011 | Davidson et al. |
| 2011/0102346 A1 | 5/2011 | Orsley et al. |
| 2011/0159321 A1 | 6/2011 | Eda et al. |
| 2011/0164372 A1 | 7/2011 | McClure et al. |
| 2011/0182084 A1 | 7/2011 | Tomlinson |
| 2011/0186345 A1 | 8/2011 | Pakula et al. |
| 2011/0188846 A1 | 8/2011 | Sorg |
| 2011/0199687 A1 | 8/2011 | Sellier et al. |
| 2011/0248152 A1 | 10/2011 | Svajda et al. |
| 2011/0255000 A1 | 10/2011 | Weber et al. |
| 2011/0255250 A1 | 10/2011 | Dinh |
| 2011/0267833 A1 | 11/2011 | Verrat-Debailleul et al. |
| 2011/0279383 A1 | 11/2011 | Wilson et al. |
| 2011/0300908 A1 | 12/2011 | Grespan et al. |
| 2012/0018323 A1 | 1/2012 | Johnson et al. |
| 2012/0027399 A1 | 2/2012 | Yeates |
| 2012/0099113 A1 | 4/2012 | de Boer et al. |
| 2012/0105400 A1 | 5/2012 | Mathew et al. |
| 2012/0118628 A1 | 5/2012 | Pakula et al. |
| 2012/0135195 A1 | 5/2012 | Glaesemann et al. |
| 2012/0136259 A1 | 5/2012 | Milner et al. |
| 2012/0151760 A1 | 6/2012 | Steijner |
| 2012/0188743 A1 | 7/2012 | Wilson et al. |
| 2012/0196071 A1 | 8/2012 | Cornejo et al. |
| 2012/0202040 A1 | 8/2012 | Barefoot et al. |
| 2012/0236477 A1 | 9/2012 | Weber et al. |
| 2012/0236526 A1 | 9/2012 | Weber et al. |
| 2012/0281381 A1 | 11/2012 | Sanford |
| 2012/0328843 A1 | 12/2012 | Cleary et al. |
| 2013/0071601 A1 | 3/2013 | Bibl et al. |
| 2013/0083506 A1 | 4/2013 | Wright |
| 2013/0182259 A1 | 7/2013 | Brezinski et al. |
| 2013/0213565 A1 | 8/2013 | Lee et al. |
| 2014/0176779 A1 | 6/2014 | Weber et al. |

FOREIGN PATENT DOCUMENTS

| | | |
|---|---|---|
| CN | 1369449 | 9/2002 |
| CN | 1694589 | 11/2005 |
| CN | 101025502 | 8/2007 |
| CN | 101206314 | 6/2008 |
| CN | 101523275 | 2/2009 |
| CN | 101465892 | 6/2009 |
| CN | 102131357 | 7/2011 |
| CN | 101267509 | 8/2011 |
| CN | 1322339 | 11/2011 |
| DE | 1771268 | 12/1971 |
| DE | 3212612 | 10/1983 |
| DE | 10322350 | 12/2004 |
| EP | 1038663 | 9/2000 |
| EP | 1592073 | 11/2005 |
| EP | 2025556 | 2/2009 |
| EP | 2036867 | 3/2009 |
| EP | 2075237 | 7/2009 |
| EP | 2196870 | 6/2010 |
| EP | 2233447 | 9/2010 |
| EP | 2483216 | 8/2012 |
| EP | 2635540 | 9/2013 |
| GB | 1346747 | 2/1974 |
| JP | H42011599 | 6/1963 |
| JP | H48006925 | 3/1973 |
| JP | H55031944 | 3/1980 |
| JP | H55067529 | 5/1980 |
| JP | H55095645 | 7/1980 |

(56) References Cited

FOREIGN PATENT DOCUMENTS

| | | |
|---|---|---|
| JP | H55136979 | 10/1980 |
| JP | H55144450 | 11/1980 |
| JP | H59013638 | 1/1984 |
| JP | H59037451 | 2/1984 |
| JP | H61097147 | 5/1986 |
| JP | H60066696 | 10/1986 |
| JP | H63060129 | 3/1988 |
| JP | H63222234 | 9/1988 |
| JP | H05032431 | 2/1993 |
| JP | S52049422 | 9/1993 |
| JP | S62042260 | 9/1994 |
| JP | H07050144 | 2/1995 |
| JP | H09073072 | 3/1997 |
| JP | S52031757 | 3/1997 |
| JP | H09507206 | 7/1997 |
| JP | H09312245 | 12/1997 |
| JP | 2000163031 | 6/2000 |
| JP | 2002003895 | 7/2000 |
| JP | 2001083887 | 3/2001 |
| JP | 2002160932 | 6/2002 |
| JP | 2002342033 | 11/2002 |
| JP | 2003502257 | 1/2003 |
| JP | 2003146705 | 5/2003 |
| JP | 2004094256 | 3/2004 |
| JP | 2004259402 | 9/2004 |
| JP | 2004339019 | 12/2004 |
| JP | 2005140901 | 6/2005 |
| JP | 2005156766 | 6/2005 |
| JP | 2005162549 | 6/2005 |
| JP | 2007099557 | 4/2007 |
| JP | 2008001590 | 1/2008 |
| JP | 2008007360 | 1/2008 |
| JP | 2008063166 | 3/2008 |
| JP | 2008066126 | 3/2008 |
| JP | 2008192194 | 8/2008 |
| JP | 2008195602 | 8/2008 |
| JP | 2008216938 | 9/2008 |
| JP | 2008306149 | 12/2008 |
| JP | 2009230341 | 10/2009 |
| JP | 2009234856 | 10/2009 |
| JP | 2010060908 | 3/2010 |
| JP | 2010064943 | 3/2010 |
| JP | 2010116276 | 5/2010 |
| JP | 2010195600 | 9/2010 |
| JP | 2010237493 | 10/2010 |
| JP | 2011032124 | 2/2011 |
| JP | 2011158799 | 8/2011 |
| JP | 2011231009 | 11/2011 |
| JP | 2011527661 | 11/2011 |
| JP | 2013537723 | 10/2013 |
| KR | 102006005920 | 1/2006 |
| KR | 102010019526 | 2/2010 |
| KR | 102011030919 | 3/2011 |
| TW | 201007521 | 2/2010 |
| TW | 201235744 | 9/2012 |
| WO | WO 00/47529 | 8/2000 |
| WO | WO 02/42838 | 5/2002 |
| WO | WO 2004/014109 | 2/2004 |
| WO | WO 2004/061806 | 7/2004 |
| WO | WO 2004/106253 | 12/2004 |
| WO | WO 2007/089054 | 8/2007 |
| WO | WO 2008/044694 | 4/2008 |
| WO | WO 2008/143999 | 11/2008 |
| WO | WO 2009/003029 | 12/2008 |
| WO | WO 2009/078406 | 6/2009 |
| WO | WO 2009/099615 | 8/2009 |
| WO | WO 2009/102326 | 8/2009 |
| WO | WO 2009/125133 | 10/2009 |
| WO | WO 2010/005578 | 1/2010 |
| WO | WO 2010/014163 | 2/2010 |
| WO | WO 2010/019829 | 2/2010 |
| WO | WO 2010/080988 | 7/2010 |
| WO | WO 2010/101961 | 9/2010 |
| WO | WO 2011/008433 | 1/2011 |
| WO | WO 2011/041484 | 4/2011 |
| WO | WO 2012/015960 | 2/2012 |
| WO | WO 2012/106280 | 8/2012 |
| WO | WO 2013/106242 | 7/2013 |

OTHER PUBLICATIONS

Author Unknown, Chemically Strengthened Glass, Wikipedia, http://en/wikipedia.org/w/index.php?title=Chemically.sub.--strengthened.s- ub.--glass&oldid=284794988, Apr. 19, 2009.

Author Unknown, "Toward Making Smart Phone Touch-Screens More Glare and Smudge Resistant", e! Science News, http://eciencenews.com/articles/2009/08/19toward.making.smart.phone.touch-.screens.more.glare.and.smudge.resistant, 1 page, at least as early as Oct. 31, 2011.

Author Unknown, Wikipedia: "Iphone 4", www.wikipedia.org, 15 pages, at least as early as Oct. 31, 2011.

Forooghian et al., "Investigative Ophthalmology & Visual Science," vol. 49, No. 10, Oct. 2008.

Karlsson et al., "The Technology of Chemical Glass Strengthening—a review," Glass Technology, European Journal of Glass Science and Technology A., vol. 51, No. 2, pp. 41-54, Apr. 2010.

Lee et al., "A Multi-Touch Three Dimensional Touch-Sensitive Tablet," Proceedings of CHI: ACM Conference on Human Factors in Computing Systems, pp. 21-25, Apr. 1985.

Ohkuma, "Development of a Manufacturing Process of a Thin, Lightweight LCD Cell," Department of Cell Process Development, IBM, Japan, Section 13.4., at least as early as Oct. 31, 2011.

Rubine, "The Automatic Recognition of Gestures," CMU-CS-91-202, Submitted in Partial Fulfillment of the Requirements of the Degree of Doctor of Philosophy in Computer Science at Carnegie Mellon University, 285 pages, Dec. 1991.

Rubine, "Combining Gestures and Direct Manipulation," CHI'92, pp. 659-660, May 1992.

Varshneya, "Chemical Strengthening of Glass: Lessons Learned and Yet to be Learned," International Journal of Applied Glass Science, vol. 1, No. 2, pp. 131-142, 2010.

Westerman, "Hand Tracking, Finger Identification and Chronic Manipulation of a Multi-Touch Surface," A Dissertation Submitted to the Faculty of the University of Delaware in Partial Fulfillment of the Requirements for the degree of Doctor of Philosophy in Electrical Engineering, 364 pages, Spring 1999.

Invitation to Pay additional fees for PCT Application No. PCT/US2015/015944, dated Jun. 9, 2015.

International Search Report and Written Opinion for PCT Application No. PCT/US2015/015944, dated Sep. 2, 2015.

EXPOSED GLASS ARTICLE WITH ENHANCED STIFFNESS FOR PORTABLE ELECTRONIC DEVICE HOUSING

CROSS-REFERENCE TO RELATED APPLICATION(S)

This application is a continuation patent application of U.S. patent application Ser. No. 15/884,700, filed Jan. 31, 2018 and titled "Exposed Glass Article with Enhanced Stiffness for Portable Electronic Device Housing," which is a continuation patent application of U.S. patent application Ser. No. 14/193,792, filed Feb. 28, 2014 and titled "Exposed Glass Article with Enhanced Stiffness for Portable Electronic Device Housing," now U.S. Pat. No. 9,886,062, the disclosure of which is hereby incorporated herein by reference in its entirety.

BACKGROUND

Conventionally, a portable electronic device has a housing that encases the various electrical components of the portable electronic device. Often, the electronic components include a display arrangement that includes various layers. The various layers usually include at least a display technology layer that provides a display screen, and may additionally include a sensing arrangement (e.g., touch sensors or touch screen). A cover window can be disposed over the display technology layer. The cover window can be a plastic or glass cover that provides a protective outer surface that protects the display arrangement. The cover window can form part of an outer surface for the housing of the portable electronic device.

In the case where the cover window is glass, the cover window may be scratch resistance. However for adequate strength, the cover window is conventionally relatively thick. With a handheld (or small scale) portable electronic device having a display arrangement, the cover window is generally part of the housing and thus needs to have sufficient rigidity to avoid warping or breaking in ordinary use conditions. Unfortunately, glass as a material is heavy. Thus, there is a competing need to make handheld portable electronic devices lighter. Consequently, there is a need for improved solutions to provide glass covers for handheld (or small scale) portable electronic devices that are sufficiently strong but also lightweight.

SUMMARY

The invention pertains to a transparent article, such as a transparent cover, for use as a cover glass for an electronic device, as well as methods for producing transparent articles. The transparent article can form a part of a housing of the portable electronic device and can provide an outer surface for a portion of the housing. The transparent article can be provided over a display of portable electronic device to provide a protective outer cover over the display. In one embodiment, the transparent article can be formed with a laminate structure. In another embodiment, the transparent article can be formed with a ribbed structure. In still another embodiment, a sapphire coating can be deposited on the transparent article to improve it strength. Advantageously, the transparent article is able to be not only thin and lightweight but also provide sufficient stiffness for use as a cover glass. The electronic device can, for example, be a portable electronic device (e.g., handheld electronic device).

Embodiments of the invention an be implemented in numerous ways, including as a method, system, device, or apparatus. Several embodiments of the invention are discussed below.

As a cover glass for a portable consumer electronic product, one embodiment can, for example, include a top layer of glass having a thickness of less than or equal to 0.4 mm, an intermediate layer of adhesive, and a bottom layer of substantially clear material having a thickness of less than or equal to 0.4 mm. A top surface of the bottom layer can be adhered to a bottom surface of the top layer via the intermediate layer of adhesive.

As a portable consumer electronic product, one embodiment can, for example, include a glass user interfacing part, a display provided internal to the portable consumer electronic device and behind the glass user interfacing part, and a processor operable to control information display on the display. The glass user interfacing part can include at least: a top layer of glass having a thickness of less than or equal to 0.4 mm, an intermediate layer of adhesive, and a bottom layer of substantially clear material having a thickness of less than or equal to 0.4 mm. A top surface of the bottom layer can be adhered to a bottom surface of the top layer via the intermediate layer of adhesive.

As a portable consumer electronic product, one embodiment can, for example, include at least: a glass user interfacing part, a display provided internal to the portable consumer electronic device and behind the glass user interfacing part, and a processor operable to control information display on the display. The glass user interfacing part can, for example, include at least: an outer layer of glass having a thickness of less than or equal to 0.4 mm, and at least one inner rib that provides structural support for the outer layer, the at least one inner rib being substantially transparent and having a thickness of less than or equal to 0.4 mm.

As a method for forming a glass article for use as an outer surface of a portable electronic device, one embodiment can, for example, include at least: obtaining an outer glass layer for the glass article; obtaining an inner glass layer for the glass article; and forming the glass article by binding the outer layer and the inner layer using an intermediate binding layer interposed there between. A portion of the outer surface of the portable electronic device can be provided by the outer glass layer of the glass article.

As a method for forming a glass article for use as an outer surface of a portable electronic device, one embodiment can, for example, include at least: forming the glass article for use as an outer surface of a portion of a housing for portable electronic device, wherein the forming includes at least providing at least one rib on an inner side of the glass article to provide increased stiffness; and attaching the glass article to the housing with the inner side of the glass article facing an internal region of the housing for the portable electronic device.

As a method for processing a glass article for used with or as an electronic device housing, one embodiment can, for example, include at least: obtaining a glass article; depositing a sapphire coating on a least a portion of a surface of the glass article; and subsequently installing the glass article to or with the electronic device housing.

Other aspects and advantages of embodiment of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS

Figure 1:
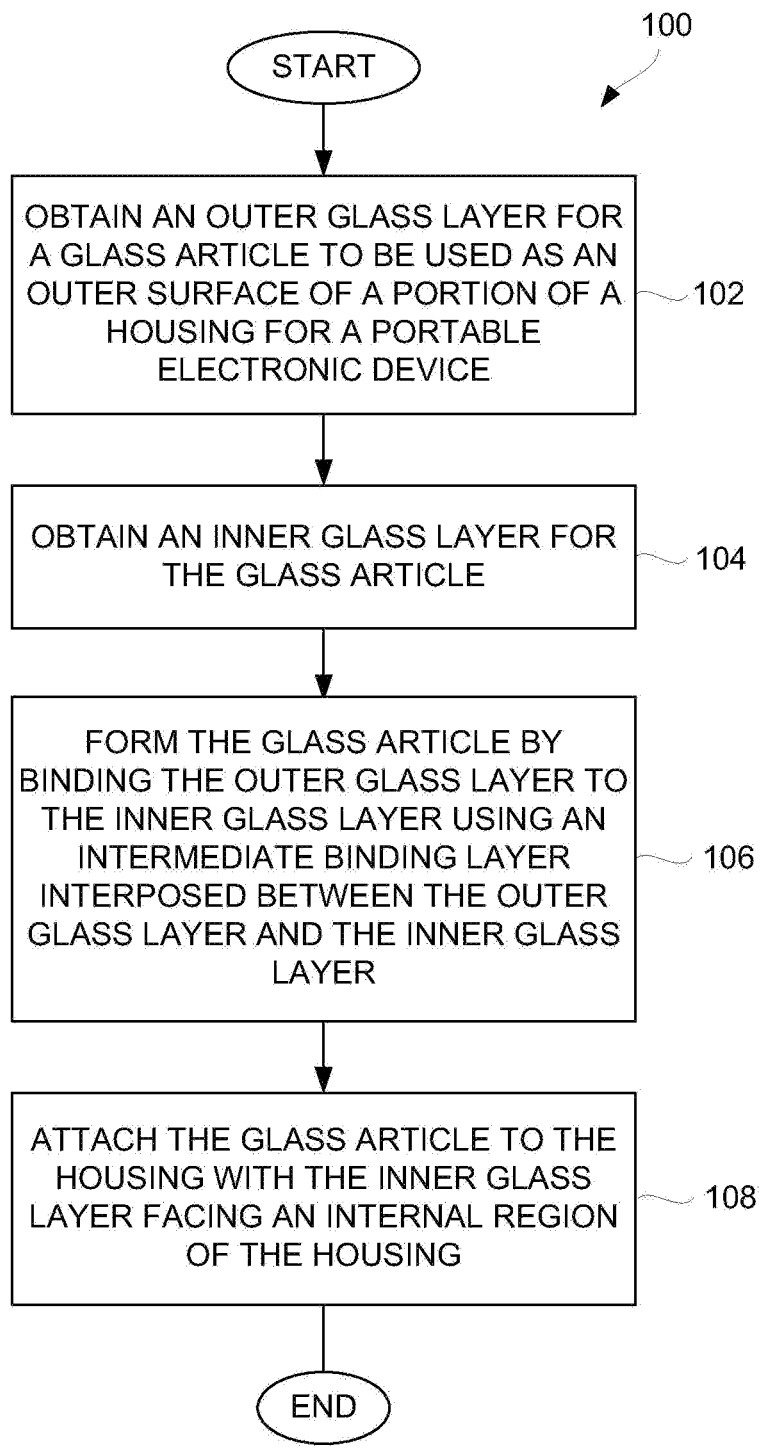
FIG. 1 is a flow diagram of glass article processing according to one embodiment.

The invention pertains to a transparent article, such as a transparent cover, for use as a cover glass for an electronic device, as well as methods for producing transparent articles. The transparent article can form a part of a housing of the portable electronic device and can provide an outer surface for a portion of the housing. The transparent article can be provided over a display of portable electronic device to provide a protective outer cover over the display. In one embodiment, the transparent article can be formed with a laminate structure. In another embodiment, the transparent article can be formed with a ribbed structure. In still another embodiment, a sapphire coating can be deposited on the transparent article to improve it strength. Advantageously, the transparent article is able to be not only thin and lightweight but also provide sufficient stiffness for use as a cover glass. The electronic device can, for example, be a portable electronic device (e.g., handheld electronic device).

According to one aspect, an electronic device can have a housing structure that is configured to receive at least one glass cover. The glass cover can serve to cover a display assembly provided within the electronic device. The glass cover can be secured to (or be part of) the housing structure and can provide a user interfacing surface for the housing structure.

Embodiments can relate to apparatus and methods for forming a housing having a thin glass member for an electronic device. In one example, the glass member may be an outer surface of an electronic device. The glass member may, for example, correspond to a glass cover that covers or forms part of a display area of an electronic device (i.e., situated in front of a display either as a separate part or integrated within the display). Alternatively or additionally, the glass member may form a part of the housing. For example, it may form an outer surface other than in the display area.

The apparatus and methods for providing thin glass articles for glass covers or displays (e.g., LCD displays) can be assembled in small form factor electronic devices such as handheld electronic devices (e.g., mobile phones, media players, personal digital assistants, remote controls, etc.) The glass can be thin in these small form factor embodiments, such as less than 3 mm, or more particularly between 0.1 and 2.5 mm, or even more particularly between 0.2 and 1.0 mm. The apparatus and methods can also be used for glass covers or displays for other devices including, but not limited to including, relatively larger form factor electronic devices (e.g., portable computers, tablet computers, displays, monitors, televisions, etc.). The glass can also be thin in these larger form factor embodiments, such as less than 5 mm, or more particularly between 0.1 and 3 mm, or even more particularly between 0.3 and 2.0 mm.

The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts. It should be appreciated that the drawings are generally not drawn to scale, and at least some features of the drawings have been exaggerated for ease of illustration.

Embodiments are discussed below with reference to FIGS. 1-12. However, those skilled in the art will readily appreciate that the detailed description given herein with respect to these figures is for explanatory purposes as the invention extends beyond these limited embodiments.

Embodiments are described herein in the context of a housing for an electronic device. The housing can make use of an outer member, which can be a transparent article. In one embodiment, the outer member can be formed of glass, which can also be referred to as a cover glass. The outer member can be secured with respect to other portions of the housing for the electronic device. The electronic device can be portable and in some cases handheld.

FIG. 1 is a flow diagram of glass article processing 100 according to one embodiment. The glass article processing 100 can serve to process multiple pieces of glass to produce a glass article suitable for use as providing an outer surface for a portable electronic device. The outer surface of a portable electronic device can, for example, provide a user interfacing surface that provides access to view a display and/or to receive user touch inputs. The glass article can, for example, be referred to as a cover glass for a portable electronic device.

The glass article processing 100 can obtain 102 an outer glass layer for a glass article. The outer glass layer can be for use as an outer surface of a portion of the housing for a portable electronic device. The glass article processing 100 also obtains 104 an inner glass layer for the glass article. Next, the glass article can be formed 106 by binding together the outer glass layer to the inner glass layer using an intermediate binding layer that is interposed between the outer glass layer and the inner glass layer. The glass layers are typically a thin piece of glass, such as having a thickness between 0.1-2.0 mm, and the glass article can also be a thin, such as having a thickness between 0.2-5.0 mm. Thereafter, the glass article can be attached 108 to the housing for the portable electronic device, such that the inner glass layer faces the internal region of the housing. When the glass article is attached to the housing for the portable electronic device, the glass article is able to abut against (e.g., directly contact) or abut adjacent (e.g., with air gap) a display assembly within the housing.

Advantageously, in one embodiment, the one or more layers of glass bound together can be such that the resulting glass article remains strong (i.e., stiff) but the combined height of the one or more glass layers remains thin and its weight is reduced as compared to using a glass article formed from a single glass layer. In other words, the laminated construction of the glass article allows it to remain thin and strong but weigh less which is important for compact portable electronic devices. Stated differently, the relative density of the intermediate binding layer is significantly less than the relative density of the outer glass layer or the inner glass layer.

Figure 2A:
FIGS. 2A-2C are diagrams illustrating manufacture of a glass article according to one embodiment.
Figure 2B:
Figure 2C:

FIGS. 2A-2C are diagrams illustrating manufacture of a glass article according to one embodiment. The manufacture of a glass article illustrated in FIGS. 2A-2C can, for example, represent processing stages of the glass article processing 100 illustrated in FIG. 1.

FIG. 2A illustrates a cross-sectional view of an outer glass layer 200 according to one embodiment. The outer glass layer 200 can, for example, provide an outer glass surface, such as a user interfacing surface, for a portable electronic device.

FIG. 2B illustrates a cross-sectional view of the outer glass layer 200 after a binding layer 202 has been deposited. In one embodiment, the binding layer 202 can be or include an optically clear adhesive.

FIG. 2C illustrates a cross-sectional view of the outer glass layer 200 after an inner glass layer 204 has be secured thereto by the binding layer 202. The assembly of the inner glass layer 204, the binding layer 202 and the outer glass layer 200 results in a glass article 206. The glass article 206 can, for example, represent a cover glass for an outer surface, such as a user interfacing surface, for a portable electronic device.

More particularly, the glass article 206 illustrated in FIG. 2C can be formed from multiple layer of glass, and the thickness of each of the layers of glass can be the same or different. Once attached 108 to the housing of a portable electronic device, the inner glass layer 204 faces internal components to the portable electronic device, such as a display and/or touch screen assembly for the portable electronic device. Typically, the inner glass layer 204 of the glass article 206 is provided closely adjacent to the display and/or touch screen assembly for the portable electronic device. For example, the inner glass layer 204 would abut, or be provided directly adjacent, the display and/or the touch screen assembly for the portable electronic device. The glass article 206 can serve as a front surface for the housing of the portable electronic device. The display and/or touch screen assembly are visible through the glass article 206 since the glass layers 200 and 204 are transparent and the binding layer 202 is transparent or substantially transparent.

Figure 3:
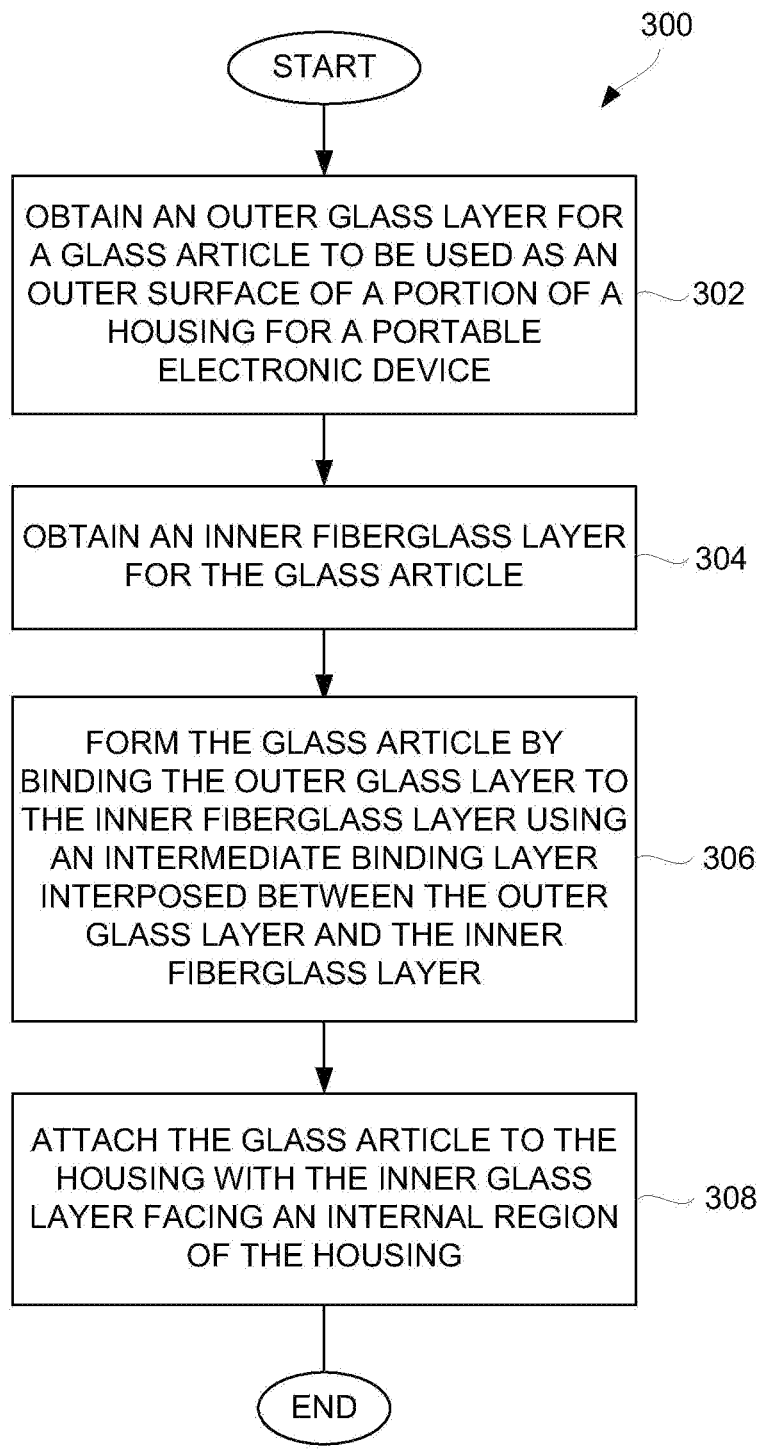
FIG. 3 is a flow diagram of glass article processing according to one embodiment.

FIG. 3 is a flow diagram of glass article processing 300 according to one embodiment. The glass article processing 300 can serve to process multiple pieces of transparent, or substantially transparent, material to produce a glass article suitable for use as providing an outer surface for a portable electronic device. The outer surface of a portable electronic device can, for example, provide a user interfacing surface that provides access to view a display and/or to receive user touch inputs. The glass article can, for example, be referred to as a cover glass for a portable electronic device.

The glass article processing 300 can obtain 302 an outer glass layer for a glass article. The outer glass layer can be for use as an outer surface of a portion of the housing for a portable electronic device. The glass article processing 300 also obtains 304 an inner fiberglass layer for the glass article. Next, the glass article can be formed 306 by binding together the outer glass layer to the inner fiberglass layer using an intermediate binding layer that is interposed between the outer glass layer and the inner fiberglass layer. The layers of glass or fiberglass are typically thin, such as having a thickness between 0.1-2.0 mm. The resulting glass article can also be a thin, such as having a thickness between 0.2-5.0 mm. Thereafter, the glass article can be attached 308 to the housing for the portable electronic device, such that the inner glass layer faces the internal region of the housing. When the glass article is attached to the housing for the portable electronic device, the glass article is able to abut against (e.g., directly contact) or abut adjacent (e.g., with air gap) a display assembly within the housing.

Advantageously, in one embodiment, the one or more layers of glass and/or fiberglass bound together can be such that the resulting glass article remains strong (i.e., stiff) but the combined height of the one or more layers remains thin and its weight is reduced as compared to using a glass article formed from a single glass layer. In other words, the multi-material construction of the glass article allows it to remain thin and strong but weigh less which is important for compact portable electronic devices. Stated differently, the relative density of fiberglass is less than glass; therefore, the weight or mass of the fiberglass portion is significantly less than the weight or mass of a layer of glass.

Although the inner layer is described as being glass in FIG. 1 and fiberglass in FIG. 3, it should be understood that more generally the inner layer can be formed of any suitable material that is at least substantially transparent as well as structurally stiff. The suitable material should also weigh less than glass.

Figure 4:
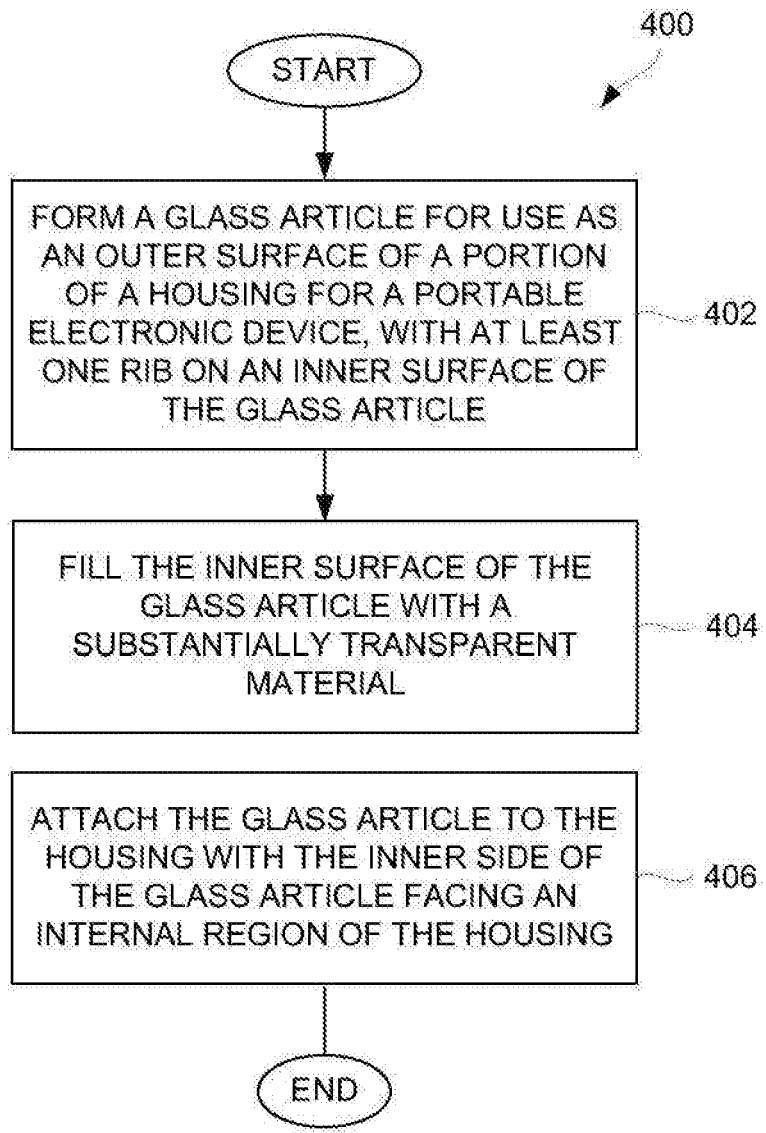
FIG. 4 is a flow diagram of glass article processing according to one embodiment.

FIG. 4 is a flow diagram of glass article processing 400 according to one embodiment. The glass article processing 400 can serve to process a piece of glass to produce a glass article suitable for use as providing an outer surface for a portable electronic device. The outer surface of a portable electronic device can, for example, provide a user interfacing surface that provides access to view a display and/or to receive user touch inputs (e.g., via a touch sensing device). The glass article can, for example, be referred to as a cover glass for a portable electronic device.

The glass article processing 400 can form a glass article for use as an outer surface for the portable electronic device. Typically, the glass article can serve as a portion of the outer surface of the housing for a portable electronic device. The glass article being formed has at least one rib on an inner surface of the glass article. The at least one rib functions as a structural member that increases the stiffness of the glass article. In one embodiment, the at least one rib is at least substantially transparent. For example, the at least one rib can be a glass or fiberglass material.

In addition, the inner surface of the glass article can be filled 404 with a substantially transparent material. A substantially transparent material also includes materials that are more than substantially transparent, such as fully or nearly fully transparent materials. Here, given the presence of the one or more ribs on the inner surface of the glass article, the inner surface of the glass article is not uniformly thick because the thickness at the places at where there are no ribs will be less than the thickness at places where there are ribs. The substantially transparent material can, for example, include or be optically clear adhesive. The substantially transparent material can be applied as a liquid or gel and then cured in place so that the inner surface of the glass article becomes essentially uniform. For example, the gaps between the one or more ribs at the inner surface of the glass article can be filled with the substantially transparent material. To reduce internal optical irregularities, the index of refraction for the substantially transparent material can be matched with the index of refraction for the glass providing the outer surface (and/or the at least one rib). The matching of the indices of refraction does not require actual matching but merely notes that the indices are to be made closer to the extent reasonably possible. In other words, the indices of refraction can be substantially matched. The matching can be facilitated by manipulating the materials utilized for the substantially transparent material and/or the glass for the outer surface so to reduce the difference between the indices of refraction between these materials. For example, if the outer surface and the at least one rib are both formed of glass, the index of refraction for the substantially transparent material can be matched or rendered relatively close to the index of refraction of glass.

Thereafter, the glass article can be attached 406 to the housing for the portable electronic device, such that the inner surface faces the internal region of the housing. When the glass article is assembled to the housing for the portable electronic device, the glass article is able to abut against (e.g., directly contact) or abut adjacent (e.g., with air gap) a display assembly within the housing.

Advantageously, in one embodiment, the amount of glass within the glass article is reduced given that the inner surface of the glass article is only glass to the extent ribs are provided. Since the filler material is typically less dense, the weight of the filler material is less than a like quantity of glass. Hence, for a given thickness of glass article, the glass article is lighter than a traditional completely glass cover window would entail.

The outer surface of the glass article and the ribs of the glass article at the inner surface together provide a lower weight glass article that is nearly as strong as a completely glass article. Hence, the height of the glass article remains thin and strong (i.e., stiff) but its weight is reduced as compared to using a glass article formed from a single glass layer.

The rib-based glass construction for the glass article allows the glass article to remain thin and strong but is also lightweight, which is important for compact portable electronic devices.

Figure 5A:
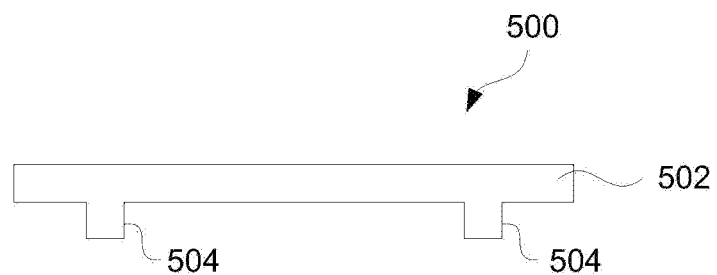
FIGS. 5A-5C are diagrams illustrating manufacture of a glass article according to one embodiment.
Figure 5B:
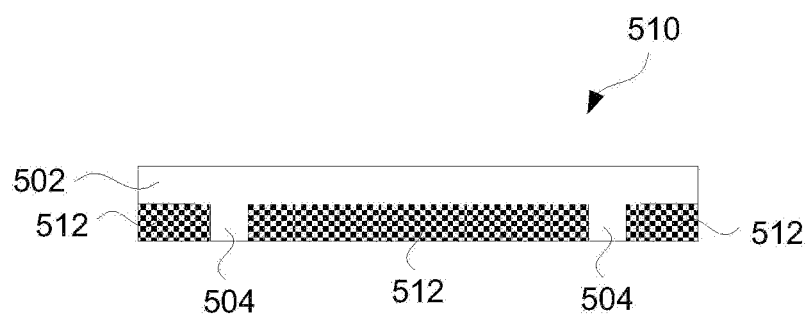
Figure 5C:
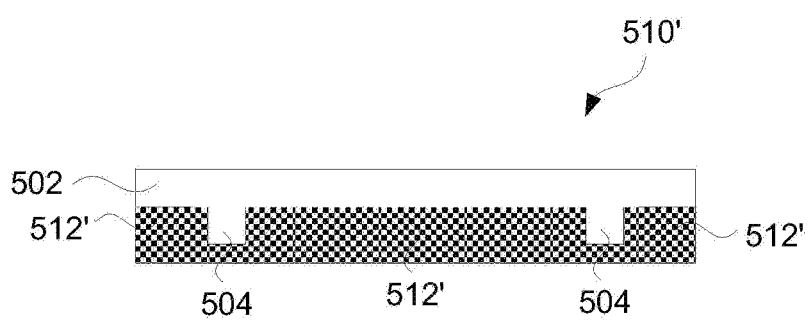

FIGS. 5A-5C are diagrams illustrating manufacture of a glass article according to one embodiment. The manufacture of a glass article illustrated in FIGS. 5A-5C can, for example, represent processing stages of the glass article processing 400 illustrated in FIG. 4.

FIG. 5A illustrates a cross-sectional view of a glass article 500 according to one embodiment. The outer glass layer 502 can, for example, provide an outer glass surface, such as a user interfacing surface, for a portable electronic device. The outer glass layer also has inner ribs 504. In one implementation, the inner ribs 504 are integral with the outer glass layer 502. In another implementation, the inner ribs 504 can be attached or bonded to an inner surface of the outer glass layer 502.

FIG. 5B illustrates a cross-sectional view of one embodiment of a glass article 510 after the inner surface has been filled in with a substantially transparent material 512. The glass article 510 can, for example, represent a cover glass for an outer surface, such as a user interfacing surface, for a portable electronic device. In one embodiment, the substantially transparent material 512 can be or include an optically clear adhesive. As shown in FIG. 5B, the substantially transparent material 512 can be used to fill in an inner surface of the glass article 510 around the inner ribs 504.

FIG. 5C illustrates a cross-sectional view of one embodiment of a glass article 510' after the inner surface has been filled in with a substantially transparent material 512'. The glass article 510' can, for example, represent a cover glass for an outer surface, such as a user interfacing surface, for a portable electronic device. In one embodiment, the substantially transparent material 512' can be or include an optically clear adhesive. As shown in FIG. 5C, the substantially transparent material 512' can be used to not only fill in an inner surface of the glass article 510' around the inner ribs 504 but also cover the inner ribs 504.

More particularly, the glass article 510' illustrated in FIG. 5C can be formed from multiple layers of glass, and the thickness of each of the layers of glass can be the same or different. Once attached 108 to the housing of a portable electronic device, the inner ribs 504 face internal components to the portable electronic device, such as a display and/or touch screen assembly for the portable electronic device. Typically, the inner ribs 504 of the glass article 510' are provided closely adjacent to the display and/or touch screen assembly for the portable electronic device. For example, the inner ribs 504 would abut, or be provided directly adjacent, the display and/or the touch screen assembly for the portable electronic device. The glass article 510' can serve as a front surface for the housing of the portable electronic device. The display and/or touch screen assembly are visible through the glass article 510'.

Generally speaking, the number, orientation, thickness, length, width and/or shape of the ribs (inner ribs) being used for structural support for a glass article may vary and can depend on implementation.

Figure 6A:
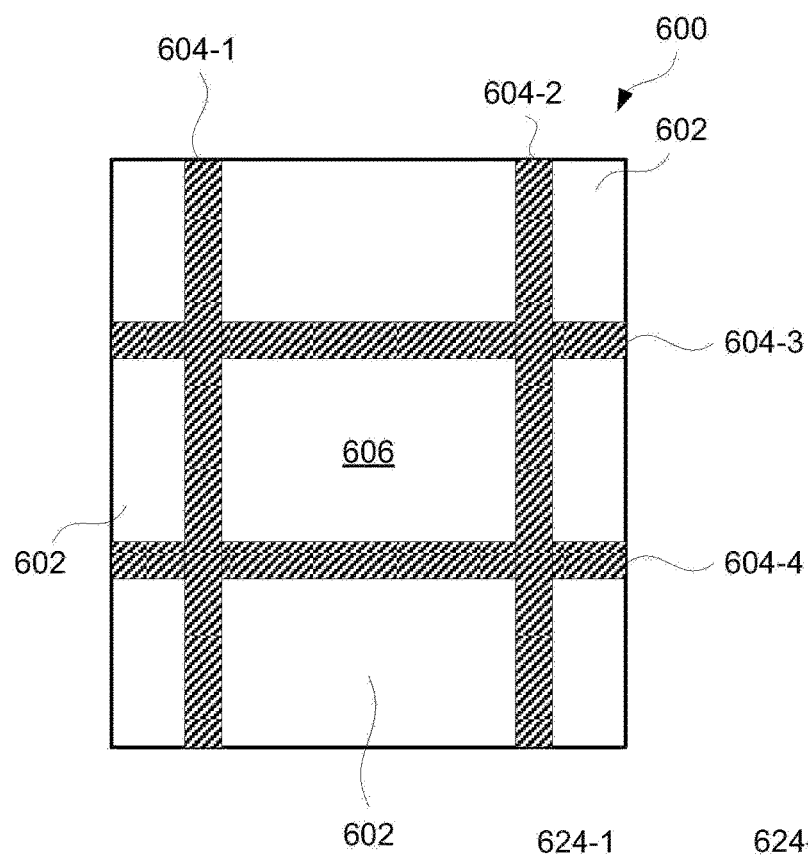
FIGS. 6A-6B are diagrams illustrating different rib configurations according to different embodiments.
Figure 6B:
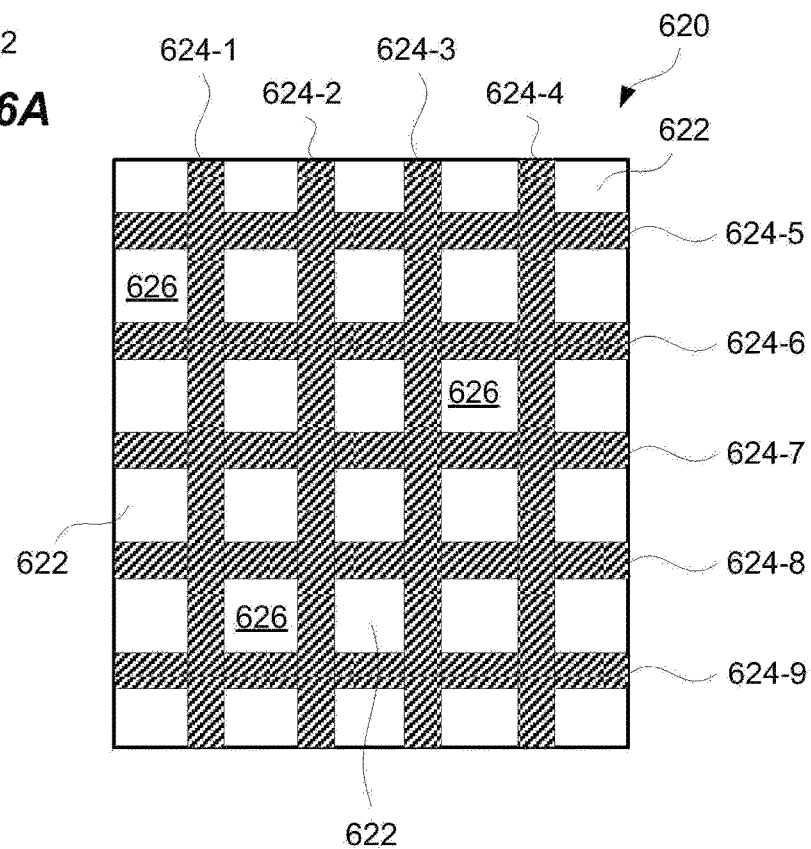

FIGS. 6A-6B are diagrams illustrating different rib configurations according to different embodiments. The rib configurations illustrated in FIGS. 6A-6B can, for example, represent rib configurations suitable for strengthening a glass article, such as a glass article formed 402 by the glass article processing 400 illustrated in FIG. 4 or the glass article 510 illustrated in FIG. 5A.

FIG. 6A illustrates a bottom view of one embodiment of a glass article 600 according to one embodiment. The glass article 600 includes four (4) ribs 604-1, 604-2, 604-3 and 604-4 on an inner surface 606 of the glass article 600. The ribs 604-1 and 604-2 are vertical ribs, and the ribs 604-3 and 604-4 are horizontal ribs. Although not shown in FIG. 6A, the inner surface can be filled in with a substantially transparent material, such as the substantially transparent material 512 shown in FIG. 5B or FIG. 5C. The glass article 600 can, for example, represent a cover glass for an outer surface, such as a user interfacing surface, for a portable electronic device. In one embodiment, the substantially transparent material can be or include an optically clear adhesive.

FIG. 6B illustrates a bottom view of one embodiment of a glass article 620 according to one embodiment. The glass article 620 includes nine (9) ribs 624-1, 624-2 624-3, 624-4, 624-5, 624-6, 624-7, 624-8 and 624-9 on an inner surface 626 of the glass article 620. The ribs 624-1, 624-2, 624-3 and 624-4 are vertical ribs, and the ribs 624-5, 624-6, 624-7, 624-8 and 624-9 are horizontal ribs. Although not shown in FIG. 6B, the inner surface can be filled in with a substantially transparent material, such as the substantially transparent material 512 shown in FIG. 5B or FIG. 5C. The glass article 620 can, for example, represent a cover glass for an outer surface, such as a user interfacing surface, for a portable electronic device. In one embodiment, the substantially transparent material can be or include an optically clear adhesive.

Figure 7:
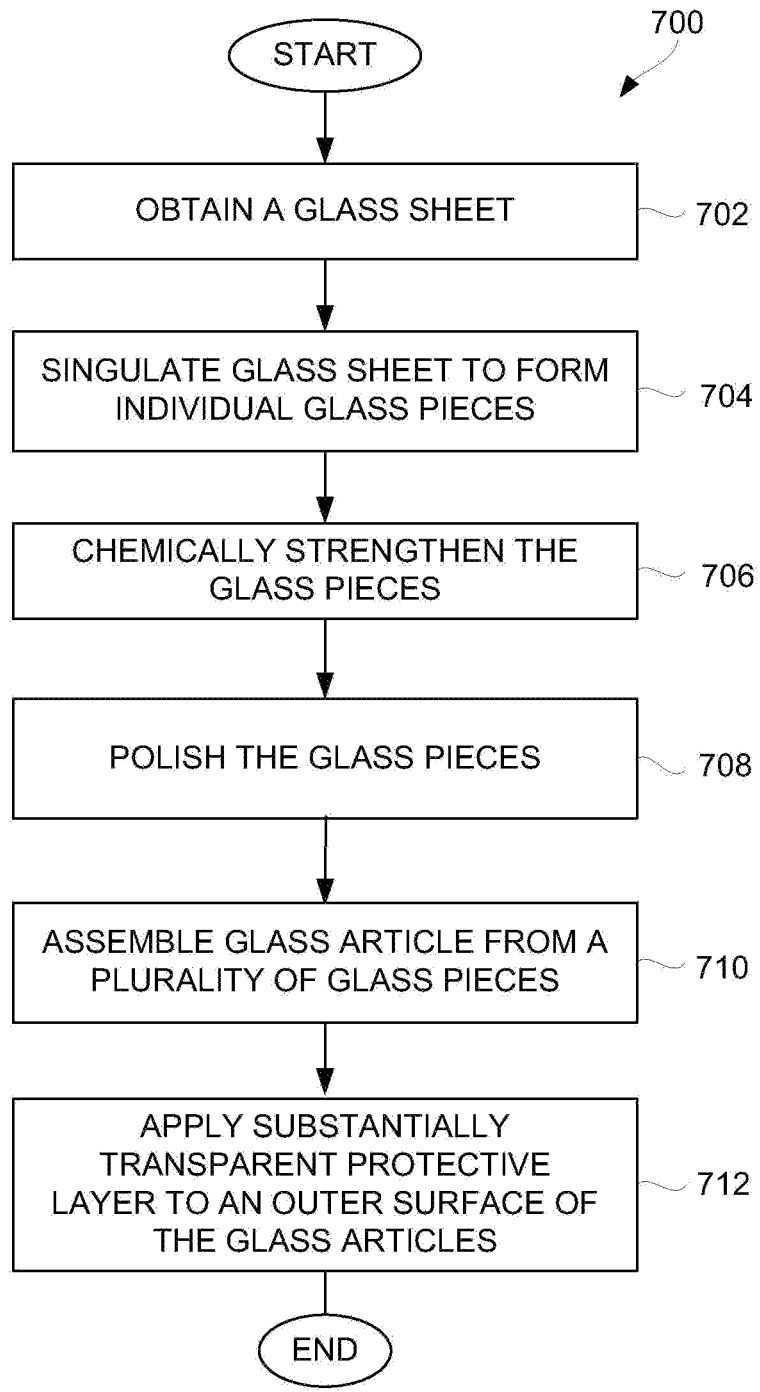
FIG. 7 is a flow diagram of glass article processing according to one embodiment.

FIG. 7 is a flow diagram of glass article processing 700 according to one embodiment. The glass article processing 700 can serve to process a sheet of glass to produce a plurality of glass articles, each of which is suitable for use as an outer surface for a portable electronic device. The outer surface of a portable electronic device can, for example, provide a user interfacing surface that provides access to view a display and/or to receive user touch inputs. The glass article can, for example, be referred to as a cover glass for a portable electronic device.

The glass article processing 700 can obtain 702 a glass sheet. The glass sheet can be processed to singulate 704 the glass sheet to form a plurality of individual glass pieces. At least some of the individual glass pieces are suitable for use as an outer surface for a portable electronic device. The singulation of the glass pieces can involve cutting and polishing. After the glass sheet is singulated 704 to form the individual glass pieces, at least some of the individual glass pieces can be individually processed as described below.

Then, at least some of the glass pieces can be chemically strengthened 706. For example, the chemical strengthening can result from placing the glass articles into ion exchange bath (e.g., a potassium bath) for a duration of time. Additional details on chemical strengthening are contained in: (i) U.S. patent application Ser. No. 12/895,823 filed Sep. 30, 2010 and entitled "ENHANCED STRENGTHENING OF GLASS", which is herein incorporated by reference; (ii) U.S. patent application Ser. No. 12/895,372, filed Sep. 30, 2010 and entitled "TECHNIQUES FOR STRENGTHENING GLASS COVERS FOR PORTABLE ELECTRONIC DEVICES", which is herein incorporated by reference; (iii) U.S. patent application Ser. No. 12/895,393, filed. Sep. 30, 2010 and entitled "TECHNIQUES FOR STRENGTHENING GLASS COVERS FOR PORTABLE ELECTRONIC DEVICES", which is herein incorporated by reference; (iv) U.S. patent application Ser. No. 13/121,385, filed Mar. 28, 2011 and entitled "TECHNIQUES FOR STRENGTHENING GLASS COVERS FOR PORTABLE ELECTRONIC DEVICES", which is herein incorporated by reference; and (v) U.S. patent application Ser. No. 12/847,926, filed Jul. 30, 2010 and entitled "ELECTRONIC DEVICE HAVING SELECTIVELY STRENGTHENING GLASS COVER GLASS", which is herein incorporated by reference.

Following the chemical strengthening 706, at least those of the glass pieces that have been chemically strengthened can be polished 708. In addition, ink (or other material) can be applied to the glass pieces that are to serve as an outer surface. The ink being applied can be utilized to make the otherwise transparent glass article opaque at portions, such as at a boundary region.

Next, a glass article is assembled 710 from a plurality of the glass pieces. In one embodiment, the glass article can be configured by a plurality of glass pieces that are layered over one another. As an example, the assembly 710 of the glass article in accordance with this embodiment can follow the operations 102-106 of the glass article processing 100 illustrated in FIG. 1. In another embodiment, the glass article can be configured by a glass piece as an outer surface and at least one structural member (i.e., rib) provided on an inner surface. As an example, the assembly 710 the glass article in accordance with this embodiment can follow the operations 402-404 of the glass article processing 400 illustrated in FIG. 4.

Finally, a translucent protective layer can be applied 712 to the outer surface of the glass articles. Following the application 712 of the translucent protective layer, the glass article processing 700 can end.

FIGS. 8A-8C and FIGS. 9A-9D are diagrams representing various stages of processing to form glass articles. The manufacture of glass pieces illustrated in FIGS. 8A-8C can, for example, represent glass processing stages of the glass article processing 700 illustrated in FIG. 7, according to one embodiment. The assembly of a glass article illustrated in FIGS. 9A-9D can, for example, represent glass processing stages of the glass article processing 700 illustrated in FIG. 7, according to one embodiment.

Figure 8A:
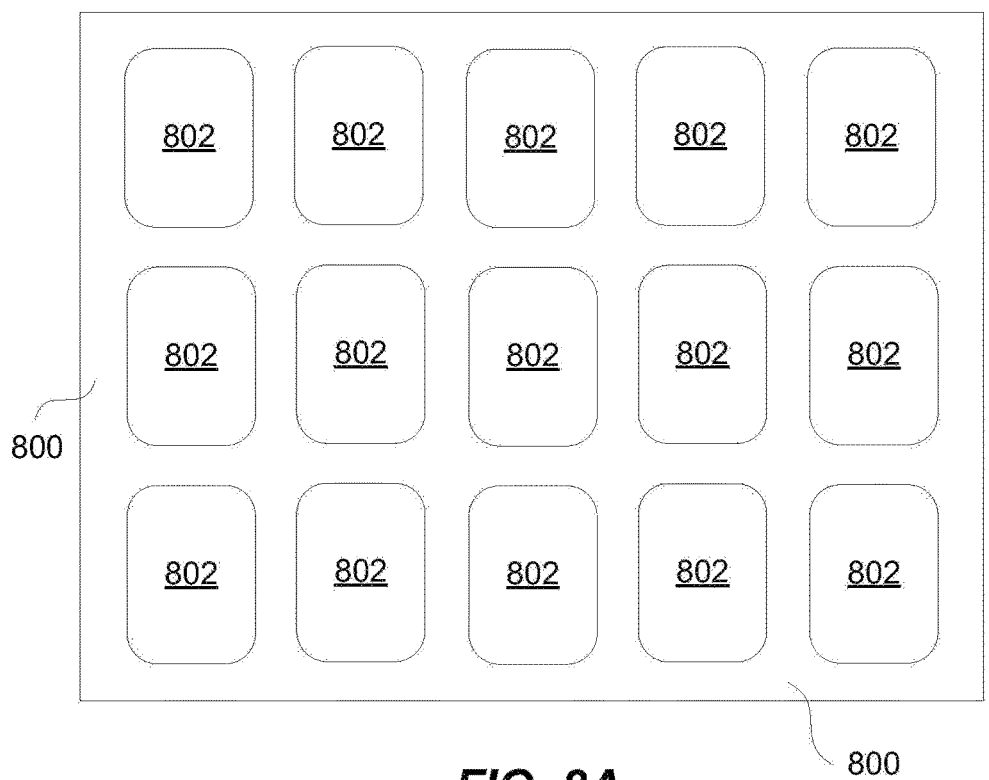
FIG. 8A illustrates a glass sheet that includes sufficient area to produce a plurality of initial glass pieces according to one embodiment.

FIG. 8A illustrates a glass sheet 800 that includes sufficient area to produce a plurality of initial glass pieces according to one embodiment. More particularly, the glass sheet obtained has a relatively thin thickness, such as between 0.2 and 2.0 mm. The glass sheet can then be processed to singulate the glass sheet 800 into individual glass pieces 802 that are used to form glass articles. The singulation can result from cutting the glass sheet using any of a number of techniques, such as scribe and break, laser cutting, water cutting, blade cutting and the like. Although the individual glass pieces 802 depicted in FIG. 8A are the same size and configuration, it should be understood by those skilled in the art that the size, shape or configuration of the glass pieces being formed from the glass sheet 800 can be different.

Figure 8B:
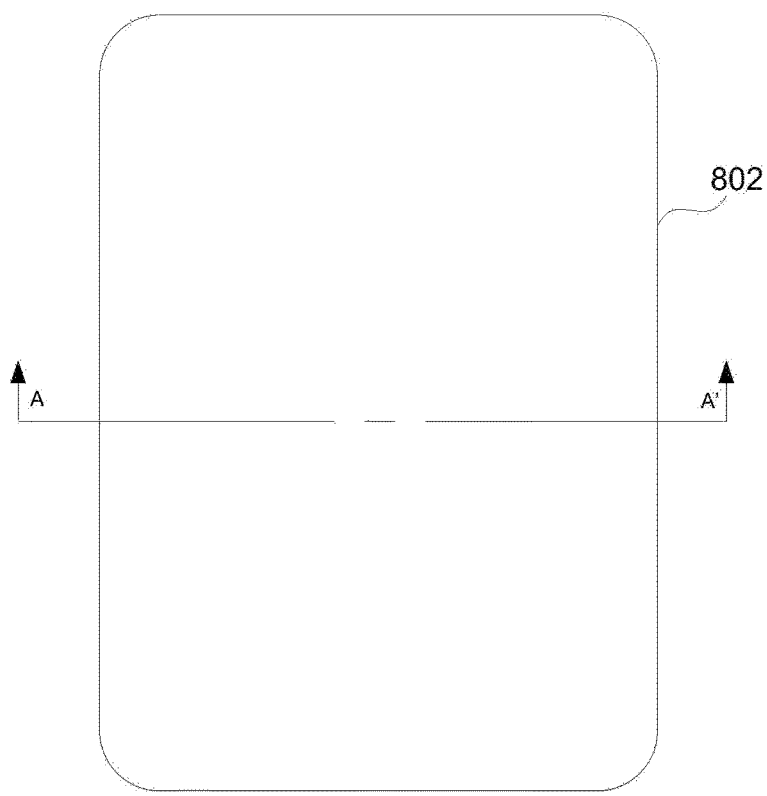
FIG. 8B illustrates a front view of one of the initial glass pieces that are produced from the glass sheet illustrated in FIG. 8A according to one embodiment.

FIG. 8B illustrates a front view of one of the initial glass pieces 802 that are produced from the glass sheet 800 according to one embodiment. Although the various illustrations in the drawings are often not to scale, it should be understood that the sheet 800 illustrated in FIG. 8A is shown in a substantially scaled down version, and that the initial glass article 802 shown in FIG. 8B is more representative of the scale of the initial glass article 802. Even so, it should be understood that the size of the initial glass article 802 would depend upon a particular device for which is used.

Figure 8C:
FIG. 8C illustrates a cross-sectional view of the glass piece shown in FIG. 8B with respect to the reference line A-A' according to one embodiment.

FIG. 8C illustrates a cross-sectional view of the glass piece 802 shown in FIG. 8B with respect to the reference line A-A' according to one embodiment.

Figure 9A:
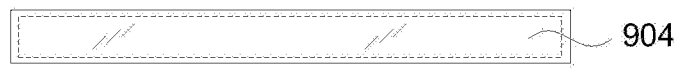
FIG. 9A-9E illustrates diagrams representing various stages of processing to form a glass article according to one embodiment.

FIG. 9A illustrates a cross-sectional view of an inner glass piece 902 and an outer glass piece 904 according to one embodiment. The inner glass piece 902 and the outer glass piece 904 can be two of the glass pieces 802. As depicted, the inner glass piece 902 and the outer glass piece 904 have undergone chemical strengthening (as denoted by the dashed line). Chemical strengthening is known in the art and typically involves placing the glass piece into an ion exchange bath (e.g., a potassium bath) for a duration of time. Additional details on chemical strengthening are contained in: (i) U.S. patent application Ser. No. 12/895,823, filed Sep. 30, 2010 and entitled "ENHANCED STRENGTHENING OF GLASS", which is herein incorporated by reference; (ii) U.S. patent application Ser. No. 12/895,372, filed Sep. 30, 2010 and entitled "TECHNIQUES FOR STRENGTHENING GLASS COVERS FOR PORTABLE ELECTRONIC DEVICES", which is herein incorporated by reference; (iii) U.S. patent application Ser. No. 12/895,393, filed Sep. 30, 2010 and entitled "TECHNIQUES FOR STRENGTHENING GLASS COVERS FOR PORTABLE ELECTRONIC DEVICES", which is herein incorporated by reference; (iv) U.S. patent application Ser. No. 13/121,385, filed Mar. 28, 2011 and entitled "TECHNIQUES FOR STRENGTHENING GLASS COVERS FOR PORTABLE ELECTRONIC DEVICES", which is herein incorporated by reference; and (v) U.S. patent application Ser. No. 12/847,926, filed Jul. 30, 2010 and entitled "ELECTRONIC DEVICE HAVING SELECTIVELY STRENGTHENING GLASS COVER GLASS", which is herein incorporated by reference.

Figure 9B:
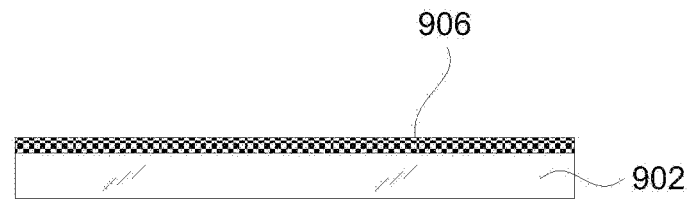

FIG. 9B illustrates a cross-sectional view of the inner glass piece 902 after binding material 906, substantially transparent adhesive, is placed (e.g., deposited) on a surface of the inner glass piece 902. The binding material 906 can be deposited in one or more layers. Although the thickness of the binding material 906 can vary depending on specific implementation, in one embodiment, the thickness of the binding material 906 is within the range of about 0.1-3.0 mm, or more particularly in the range of about 0.1-2.0 mm.

Figure 9C:
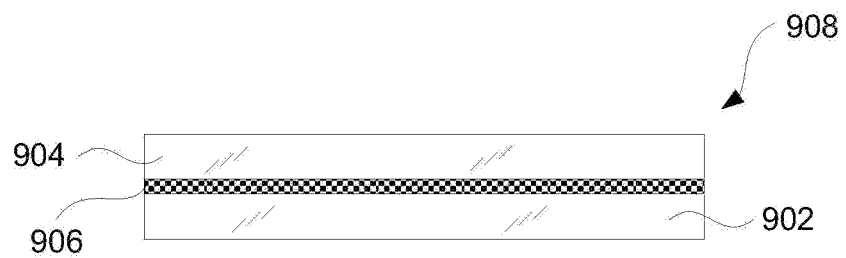

FIG. 9C illustrates a cross-sectional view of a glass article 908 formed after the outer glass piece 904 is place over the binding material 906 and thereby secured to the inner glass piece 902. As shown in FIG. 9C, the outer glass piece 904 is aligned with the inner glass piece 902. As such, the glass article 908 has a laminate structure. In other words, the glass article 908 uses multiple layers so that the composite article achieves improved strength and/or reduced mass.

Figure 9D:
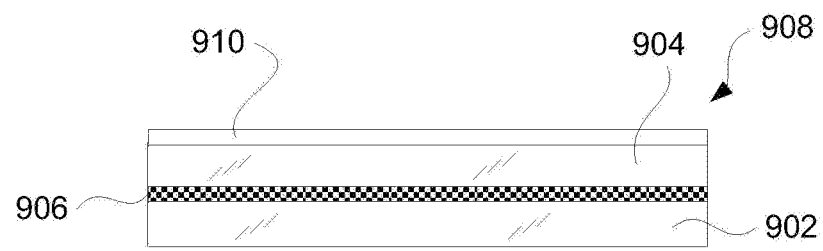

FIG. 9D illustrates a cross-sectional view of the glass article 908 after further processing causes a layer of protective coating 910 to be deposited on an outer facing surface of the glass article 908, i.e., on an out surface of the outer glass piccoarticle 904. For example, the layer of protective coating 910 can be an anti-smudge coating, such as an oleophobic coating.

Figure 9E:
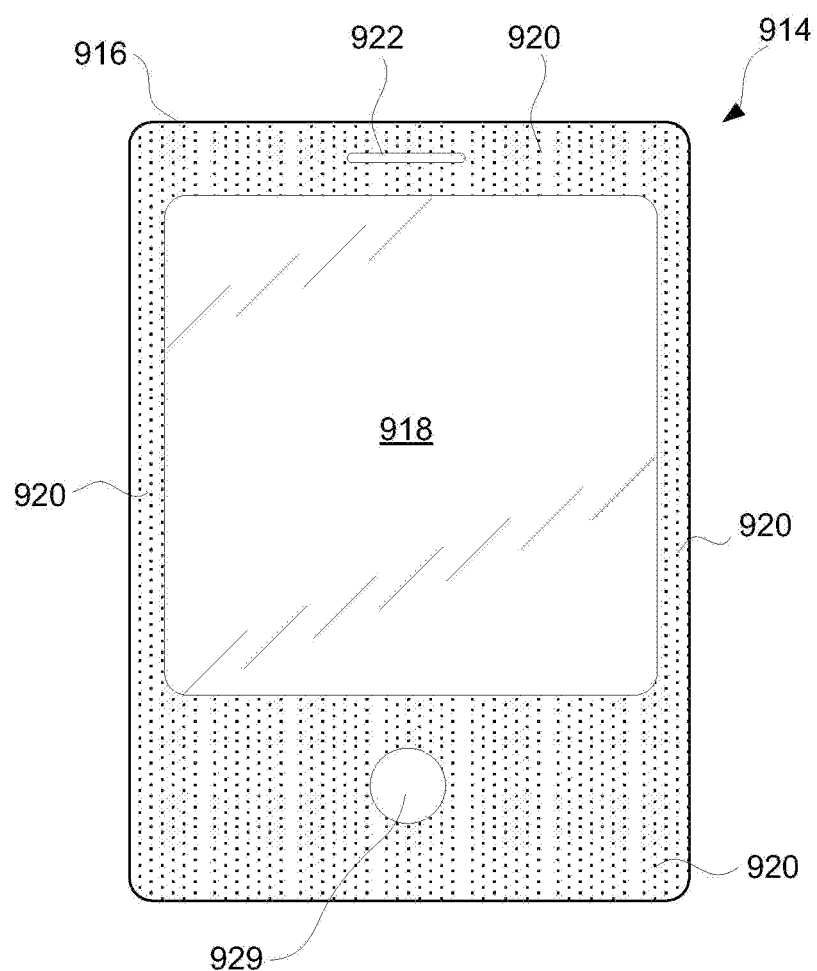

FIG. 9E illustrates a front view for a resulting glass article 914 according to embodiment. The resulting glass article 914 can be provided as a front surface (e.g., cover glass) for a housing for a corresponding portable electronic device. The resulting glass article 914 can pertain to the glass article 908 illustrated in FIG. 9D. The resulting glass article 914 can result from the glass article processing 700 illustrated in FIG. 7. In this exemplary embodiment shown in FIG. 9E, the resulting glass article 914 has a glass body 916. The glass body 916 includes a translucent central region 918 and an opaque peripheral region 920. In this embodiment, the opaque peripheral region 920 results from a masking material (e.g., ink) provided in on one or more of the surfaces of the inner glass piece 902 or the outer glass piece 904. However, since the central region 918 does not receive the masking material, the central region 918 remains transparent. The resulting glass article 914 can include an opening 922 for a speaker provided in the housing for the corresponding portable electronic device. The resulting glass article 914 can also include an opening 924 for a microphone provided in the housing for the corresponding portable electronic device.

Figure 10:
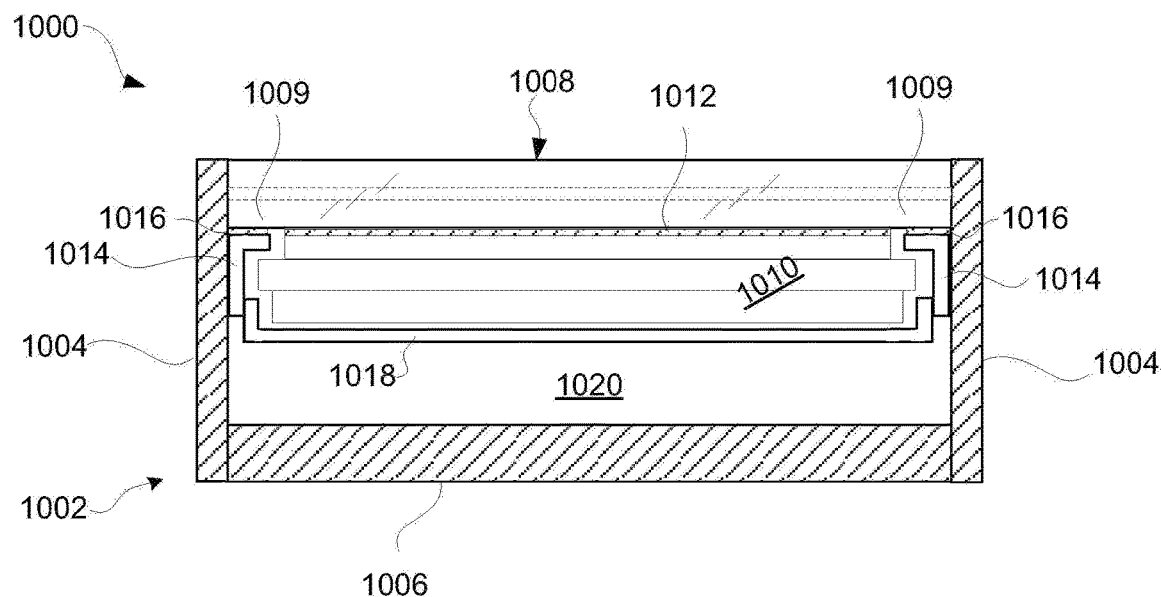
FIG. 10 is a cross-sectional view of an electronic device housing according to one embodiment.

FIG. 10 is a cross-sectional view of an electronic device housing 1000 according to one embodiment. The electronic device housing 1000 includes a housing 1002. The housing 1002 includes side members 1004 and a bottom member 1006. A transparent member 1008 can be provided as a top surface for the electronic device housing 1000. For example, the transparent member 1008 can be a glass member, often referred to as a glass window or cover glass. The transparent member 1008 can, for example, be produced by the methods and apparatus discussed above. Although the transparent member 1008 is often formed of glass, in an alternative embodiment, the transparent member 1008 can be formed of a polymer-based member (e.g., plastic). The transparent member 1008 can also include an opaque region 1009. The opaque region 1009 shown in FIG. 10 is at a peripheral region of an inner surface of the transparent member 1008. The opaque region 1009 can provide a cosmetic or masking effect for the components or structures within the electronic device housing 1000 that are located at the peripheral portion of the electronic device housing 1000. The opaque region 1009 can be formed by any of various methods, including those discussed above.

The electronic device housing 1000 can include a touch screen assembly 1010. The touch screen assembly 1010 can include a plurality of touch and display components that are laminated together. The touch and display components can, for example, include a display technology layer (e.g., LCD panel), a sensing layer (e.g., touch sensors) and/or a backlight layer. The touch screen assembly 1010 is secured within the electronic device housing 1000. In one embodiment, the touch screen assembly 1010 can be secured to a bottom surface of the transparent member 1008 by a layer of adhesive 1012 (e.g., clear adhesive). Alternatively or additionally, in another embodiment, the touch screen assembly 1010 can be secured to the side members 1004 of the electronic device housing 1000 via a brackets, adhesive or other means. For example, the electronic device housing 1000 can include mounting brackets 1014 that are secured to not only the side members 1004 of the electronic device housing 1000 (by any of a variety of techniques, including welding, screws, snaps or adhesive) but also the peripheral portion of the bottom surface of the transparent member 1008 with a layer of adhesive 1016. The mounting brackets 1014 can be formed of metal (e.g., aluminum, stainless steel, titanium copper) or a polymer. The mounting brackets 1014 can be thin such as on the order of 0.1-0.6 mm. In one embodiment, the mounting brackets 1014 can include a pair of rails secured to opposite sides of the peripheral portion of the bottom surface of the transparent member 1008 with the layer of adhesive 1016.

The electronic device housing 1000 can also include a frame 1018. The frame 1018 is provided within the electronic device housing 1000 and provided adjacent to a bottom surface of the touch screen assembly 1010. In one embodiment, there is a small gap between the frame 1018 and the bottom surface on the touch screen assembly 1010. The frame 1018 can serve to provide stiffness to the electronic device housing 1000 and can also provide a surface that protects the touch screen assembly 1010. The frame 1018 can be secured to the mounting brackets 1014 or the side members 1004 by any of a variety of techniques (e.g., welding, screws, snaps, adhesive).

An internal space 1020 is provided internal to the electronic device housing 1000 whereby various electrical components (e.g., including processor, memory, battery and circuit board) can be attached, affixed or placed so as to provide electronic operations for the electronic device.

In general, the various members, parts or assemblies of the electronic device housing 1000 can be formed of any of a variety of materials, e.g., glass, polymers or metal. In one embodiment, the transparent member 1008 is glass, the mounting brackets 1014 and the frame 1018 are formed from metal or polymer (e.g., plastic), and the housing 1002 is formed from glass, polymer (e.g., plastic) or metal.

Figure 11:
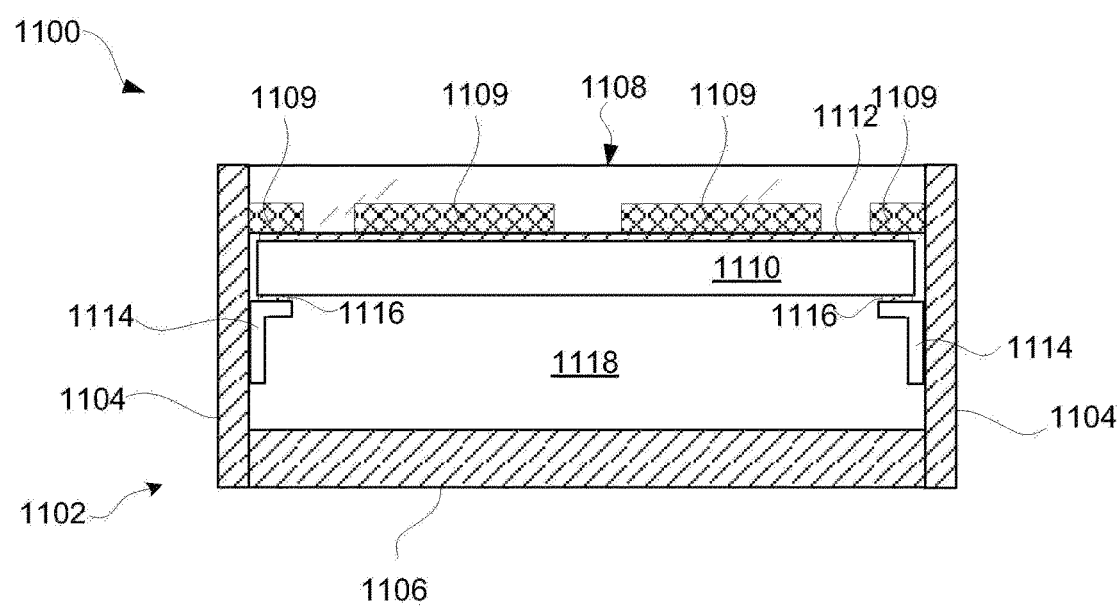
FIG. 11 is a cross-sectional view of an electronic device housing according to one embodiment.

FIG. 11 is a cross-sectional view of an electronic device housing 1100 according to one embodiment. The electronic device housing 1100 includes a housing 1102. The housing 1102 includes a side member 1104 and a bottom member 1106. A transparent member 1108 can be provided as a top surface for the electronic device housing 1100. For example, the transparent member 1108 can be a glass member, often referred to as a glass window or cover glass. The transparent member 1108 can, for example, be produced by the methods and apparatus discussed above. Although the transparent member 1108 is often formed of glass, in an alternative embodiment, the transparent member 1108 can be formed of a polymer-based member (e.g., plastic). The transparent member 1108 can also include an opaque region 1109. The opaque region 1109 shown in FIG. 11 is at a peripheral region of an inner surface of the transparent member 1108. The opaque region 1109 can provide a cosmetic or masking effect for the components or structures within the electronic device housing 1100 that are located at the peripheral portion of the electronic device housing 1100. The opaque region 1009 can be formed by any of various methods, including those discussed above.

The electronic device housing 1100 can include a display screen assembly 1110. The display screen assembly 1110 can be secured to a bottom surface of the transparent member 1108 by a layer of adhesive 1112 (e.g., clear adhesive). The display screen assembly 1110 can include one or a plurality of distinct technology components that can be laminated together. In one implementation, the technology components can, for example, include a sensing layer (e.g., touch sensors), a display technology layer (e.g., LCD panel) and/or a backlight layer. In another implementation, the technology components can, for example, include an organic light emitting diode (OLED) panel with or without a sensing layer e.g., touch sensors).

The touch screen assembly 1110 is secured within the electronic device housing 1100. In one embodiment, the touch screen assembly 1110 can be secured to a bottom surface of the transparent member 1108 by a layer of adhesive 1112 (e.g., clear adhesive). Additionally, the electronic device housing 1100 can include mounting brackets 1114 that are secured to the peripheral portion of the bottom surface of the display screen assembly 1110 with a layer of adhesive 1116. The mounting brackets 1114 can be formed of metal (e.g., aluminum, stainless steel, titanium copper) or a polymer. The mounting brackets 1114 can be thin such as on the order of 0.1-0.6 mm. In one embodiment, the mounting brackets 1114 can include a pair of rails secured to opposite sides of the peripheral portion of the bottom surface of the display screen assembly 1110 with the layer of adhesive 1116.

An internal space 1118 is provided internal to the electronic device housing 1100 whereby various electrical components (e.g., including processor, memory, battery and circuit board) can be attached, affixed or placed so as to provide electronic operations for the electronic device.

In general, the various members, parts or assemblies of the electronic device housing 1100 can be formed of any of a variety of materials, e.g., glass, polymers or metal. In one embodiment, the transparent member 1108 is glass, the mounting brackets 1114 are formed from metal or polymer (e.g., plastic), and the housing 1102 is formed from glass, polymer (e.g., plastic) or metal.

According to another aspect, an electronic device housing can be provided with a glass article that has a hard protective coating that improves durability and strength of the glass article. In one embodiment, the hard protective coating is a coating of sapphire applied to the glass article.

Figure 12:
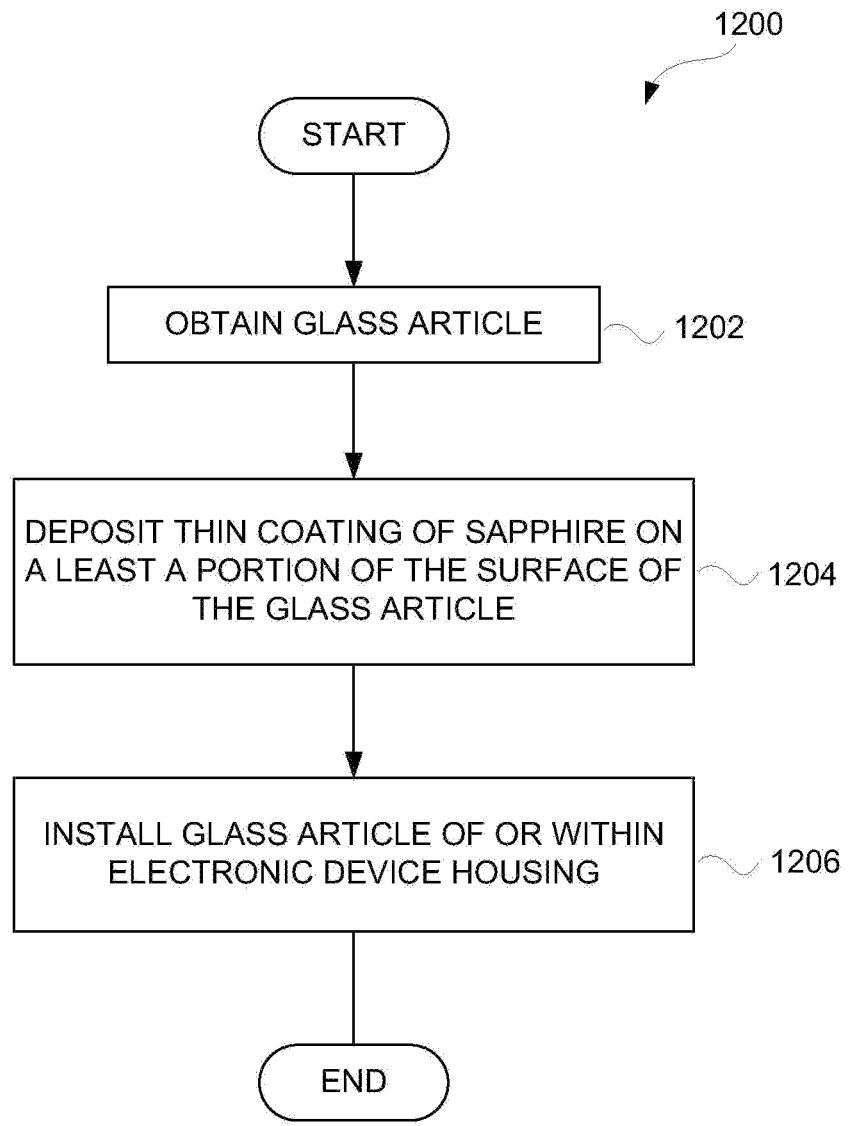
FIG. 12 is a flow diagram of a housing assembly process according to one embodiment.

FIG. 12 is a flow diagram of a housing assembly process 1200 according to one embodiment. The housing being assembled can pertain to a housing for an electronic device, such as a portable electronic device. The housing can include one or more glass components that can serve as a portion of the housing.

The housing assembly process 1200 can obtain 1202 a glass article that is to be utilized as part of the housing for an electronic device. The glass article can serve as an outer surface for a portion of the housing. For example, the glass article can be referred to as a cover glass and serve as a front glass cover for the housing. The thickness and size of the glass article varies with application. In one embodiment, the glass article has a thickness less than or equal to 5 (five) mm. In another embodiment, the glass article has a thickness less than or equal to 3 (three) mm. In another embodiment, the glass article has a thickness less than or equal to 1 (one) mm. Also, it should be recognized that the glass article can be pre processed to chemically strengthen the glass article.

After the glass article has been obtained 1202, the glass article can be processed to improve its strength. In this regard, a sapphire coating can be deposited 1204 on at least a portion of the surface of the glass article. The sapphire coating is a thin coating (e.g., thin film) that can be applied to one or more surfaces of the glass article. In one embodiment, the thickness of the sapphire coating is less than or equal to 0.1 mm.

The sapphire coating can be transparent or substantially transparent and, thus, not substantially impede the ability to use the glass article as a transparent cover glass for the housing. However, the sapphire coating can be deposited 1204 to those portions of a surface of the glass article. For example, an outer top surface of the glass article can be coated with sapphire. Since the glass article can remain transparent (or substantially transparent) even with the sapphire coating, the coated glass article thus remains suitable for use as a user interfacing surface. In one embodiment, the sapphire coating can be deposited 1204 using a plasma-assisted Physical Vapor Deposition (PVD) process. In another embodiment, the sapphire coating can be deposited 1204 using a sputtering process. Although the sapphire coating can be applied over an entire surface, e.g., the entire outer surface, of the glass article, in some embodiment, there may be a desire to only coat certain portions of a glass article with sapphire. In one implementation, a masking operation can facilitate selectively depositing 1204 of sapphire coating to certain portions of the glass article.

By providing the glass article with the sapphire coating, the resulting glass article is more durable and/or harder. In areas where the glass article has the sapphire coating, the resulting glass article is significantly more resistant to breakage due to impact forces, such as sharp, blunt or edge impacts since the coating is harder than glass alone.

After the sapphire coating has been deposited 1204, the processed glass article with the sapphire can be installed 1206 on or within the housing for the electronic device. As previously noted, with selectively depositing the sapphire, the processed glass article can remain suitable for use as a user interfacing surface of the housing. For example, the processed glass article can be used as a cover glass for a front face of a portable electronic device housing. the processed glass article with its coatings can be well suited for use as a user interfacing surface, the processed glass article need not be exposed to user interactions but instead can be provided internal to the housing. After the glass article has been installed 1206, the housing assembly process 1200 can end.

Figure 13:
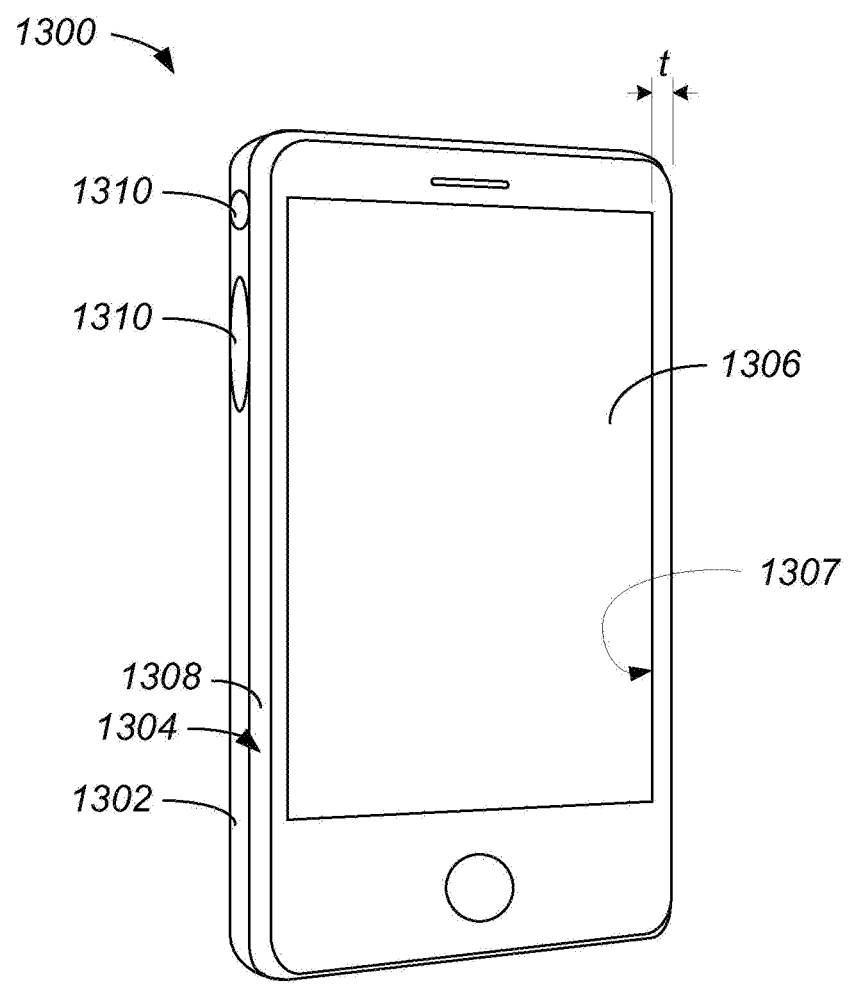
FIG. 13 is a perspective diagram of a handheld electronic device according to one embodiment.

FIG. 13 is a perspective diagram of a handheld electronic device 1300 according to one embodiment. The handheld electronic device 1300 may include a housing 1302, e.g., a periphery member, that is arranged to at least partially surround the periphery of the handheld electronic device 1300 to form some or all of the outer-most side, top and bottom surfaces of the handheld electronic device 1300. The handheld electronic device 1300 also includes a cover piece 1304 that is arranged to be substantially coupled to housing 1302 to effectively enclose an inner volume of the handheld electronic device 1300. The cover piece 1304 may include a glass member 1306, e.g., cover glass, provided over a display of the handheld electronic device 1300. In one embodiment, the cover piece 1304 can include a protective frame 1308 in which glass member 1306 is held. The glass member 1306 can serve as the top surface of the housing 1302. A display region 1307 of the glass member 1306 is that portion of the glass member 1306 that corresponds to the display (e.g., active display region).

The housing 1302 may have any suitable shape, including, for example, one or more elements that may be combined to form a rectangular structure. The housing 1302 may at least partially enclose an inner volume in which electronic device components may be assembled and retained. The shape of housing 1302 may substantially define boundaries of the inner volume, and may be determined based upon the size and type of components placed within the inner volume.

The housing 1302 may have any suitable size, and the size may be determined based on any suitable criteria. Suitable criteria may include, but are not limited to including, aesthetics or industrial design, structural considerations, components required for a desired functionality, and/or product design. The housing 1302 may have any suitable cross-section, including for example a variable cross-section or a constant cross-section. In some embodiments, the cross-section may be selected based on desired structural properties for housing 1302. For example, the cross-section of housing 1302 may be substantially rectangular, such that the height of housing 1302 is substantially larger than the width of housing 1302. Such a cross-sectional shape may provide structural stiffness in compression and tension, as well as in bending. In some embodiments, the dimensions of housing 1302 cross-section may be determined relative to the dimensions of the components contained by housing 1302.

In some embodiments, housing 1302 may include features 1310. The features 1310 may generally include one or more openings, knobs, extensions, flanges, chamfers, or other features for receiving components or elements of the device. The features 1310 of the housing 1302 extend from any surface of housing 1302, including for example from internal surfaces, e.g., to retain internal components or component layers, or from external surfaces. In particular, the housing 1302 may include a slot or opening (not shown) for receiving a card or tray within the handheld electronic device 1300. The housing 1302 may also include a connector opening (not shown), e.g., for a 30-pin connector, through which a connector may engage one or more conductive pins of the handheld electronic device 1300. Other features 1310 included on the housing 1302 may include, but are not limited to, an opening for providing audio to a user, an opening for receiving audio from a user, an opening for a connector (e.g., audio connector or power supply connector), and/or features for retaining and enabling a button such as a volume control or silencing switch.

Although various embodiments discussed herein include a touch screen assembly, various other embodiments may not include touch screen capabilities. In such other embodiments, a display assembly would be used in place of the touch screen assembly. The display assembly includes at least a display technology layer. The display assembly can also include a back light component.

In general, the steps associated with the methods of the present invention may vary widely. Steps may be added, removed, altered, combined, and reordered without departing from the spirit or the scope of the present invention.

The techniques describe herein may be applied to glass surfaces used by any of a variety of electronic devices including but not limited handheld electronic devices, portable electronic devices and substantially stationary electronic devices. Examples of these include any known consumer electronic device that includes a display. By way of example, and not by way of limitation, the electronic device may correspond to media players, mobile phones (e.g., cellular phones), PDAs, remote controls, notebooks, tablet PCs, monitors, all in one computers and the like.

The various aspects, features, embodiments or implementations of the invention described above can be used alone or in various combinations.

Although only a few embodiments of the invention have been described, it should be understood that the invention may be embodied in many other specific forms without departing from the spirit or the scope of the present invention. By way of example, the steps associated with the methods of the invention may vary widely. Steps may be added, removed, altered, combined, and reordered without departing from the spirit of the scope of the invention. Similarly, while operations are depicted in the drawings in a particular order, this should not be understood as requiring that such operations be performed in the particular order shown or in sequential order, or that all illustrated operations be performed, to achieve desirable results.

While this specification contains many specifics, these should not be construed as limitations on the scope of the disclosure or of what may be claimed, but rather as descriptions of features specific to particular embodiment of the disclosure. Certain features that are described in the context of separate embodiments can also be implemented in combination. Conversely, various features that are described in the context of a single embodiment can also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An electronic device comprising:
   a display;
   a glass housing at least partially surrounding the display;
   a glass cover coupled to the glass housing and comprising:
      a glass sheet defining an outer surface of the electronic device; and
      a set of glass ribs extending along an inner surface of the glass sheet; and a touch sensing device positioned under the glass cover and configured to detect a touch input along the outer surface.

2. The electronic device of claim 1, wherein:
the set of glass ribs includes a first subset of glass ribs, each glass rib of the first subset of glass ribs extending along a first direction; and
the set of glass ribs includes a second subset of glass ribs, each glass rib of the second subset of glass ribs extending along a second direction that is transverse to the first direction.

3. The electronic device of claim 2, wherein:
an array of gaps are defined by the first and second subsets of glass ribs;
a transparent material fills each gap of the array of gaps;
the set of glass ribs is formed from a glass material having a first density; and
the transparent material has a second density that is lower than the first density.

4. The electronic device of claim 3, wherein:
the glass sheet is a first glass sheet; and
the glass cover further comprises a second glass sheet that is positioned between the first glass sheet and the set of glass ribs.

5. The electronic device of claim 1, wherein the glass sheet is chemically strengthened using an ion exchange process.

6. A portable electronic device comprising:
a housing;
a display positioned at least partially within the housing; and
a cover positioned over the display and coupled to the housing, the cover comprising:
an outer glass sheet that defines at least a portion of an exterior surface of the portable electronic device; and
an array of glass ribs bonded to the outer glass sheet and extending at least partially across an inner surface of the outer glass sheet.

7. The portable electronic device of claim 6, wherein:
the cover defines a central region at least partially surrounded by a peripheral region; and
the array of glass ribs are configured to increase a stiffness of the central region while the cover is attached to the housing.

8. The portable electronic device of claim 6, wherein:
the cover defines a central region at least partially surrounded by a peripheral region; and
at least one glass rib of the array of glass ribs extends at least partially across the central region.

9. The portable electronic device of claim 6, wherein:
at least one glass rib of the array of glass ribs is transparent; and
the at least one glass rib extends across the display.

10. The portable electronic device of claim 6, wherein:
the cover has a thickness that ranges between 0.1 mm and 2 mm; and
the display is a touchscreen that is configured to detect a touch along an outer surface of the cover.

11. The portable electronic device of claim 6, wherein the housing is formed from a glass material.

12. The portable electronic device of claim 6, wherein:
a pair of glass ribs of the array of glass ribs defines a gap; and
a transparent material at least partially fills the gap.

13. The portable electronic device of claim 12, wherein:
the pair of glass ribs are formed from a glass material having a first density; and
the transparent material has a second density that is less than the first density.

14. The portable electronic device of claim 12, wherein:
the transparent material is an optically clear adhesive;
the pair of glass ribs are formed from a glass material having a first index of refraction; and
the optically clear adhesive has a second index of refraction that is substantially matched to the first index of refraction.

15. An electronic device comprising:
a housing;
a display positioned at least partially within the housing; and
a cover coupled to the housing and comprising:
a glass sheet that defines an outer surface of the electronic device and an inner surface that is opposite to the outer surface; and
a set of glass ribs extending at least partially along the inner surface of the glass sheet.

16. The electronic device of claim 15, wherein the set of glass ribs is bonded to the glass sheet.

17. The electronic device of claim 16, wherein the set of glass ribs is bonded to the glass sheet using an optically clear adhesive that is positioned between the inner surface of the glass sheet and the set of glass ribs.

18. The electronic device of claim 17, wherein:
a pair of glass ribs of the set of glass ribs at least partially define a gap; and
the optically clear adhesive at least partially fills the gap.

19. The electronic device of claim 18, wherein the optically clear adhesive has an index of refraction that is substantially matched to a glass material of the pair of glass ribs.

20. The electronic device of claim 15, wherein the set of glass ribs is integrally formed with the glass sheet.

* * * * *